(12) United States Patent
Huang et al.

(10) Patent No.: US 12,720,861 B2
(45) Date of Patent: Aug. 25, 2026

(54) COMPATIBLE HYBRID-CELL STRUCTURE, DEVICE HAVING THE SAME, AND METHOD

(71) Applicant: TAIWAN SEMICONDUCTOR MANUFACTURING COMPANY, LTD., Hsinchu (TW)

(72) Inventors: Ching-Yu Huang, Hsinchu (TW); Wei-Cheng Tzeng, Hsinchu (TW); Wei-Cheng Lin, Hsinchu (TW); Chia-Tien Wu, Hsinchu (TW); Ken-Hsien Hsieh, Hsinchu (TW); Jiann-Tyng Tzeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 470 days.

(21) Appl. No.: 18/504,286

(22) Filed: Nov. 8, 2023

(65) Prior Publication Data

US 2025/0151394 A1 May 8, 2025

(51) Int. Cl.

*H10D 86/01* (2026.01)
*H10D 84/40* (2025.01)
*H10D 84/90* (2025.01)

(52) U.S. Cl.

CPC ....... *H10D 86/0221* (2025.01); *H10D 84/401* (2025.01); *H10D 84/929* (2025.01); *H10D 84/959* (2025.01); *H10D 84/981* (2025.01)

(58) Field of Classification Search

CPC .... H10W 20/43; H10W 20/427; H10D 89/10; H10D 84/851

See application file for complete search history.

(56) References Cited

U.S. PATENT DOCUMENTS

2022/0199527 A1* 6/2022 Pelloie ................ H10W 20/427
2022/0293522 A1 9/2022 Thyagarajan et al.
2024/0145343 A1* 5/2024 Park ....................... H10D 89/10

FOREIGN PATENT DOCUMENTS

| | | |
|---|---|---|
| CN | 115527940 | 12/2022 |
| TW | 202018864 | 5/2020 |
| WO | 200171808 | 9/2001 |

* cited by examiner

*Primary Examiner* — Steven B Gauthier
*Assistant Examiner* — Marc-Anthony Armand
(74) *Attorney, Agent, or Firm* — Hauptman Ham, LLP

(57) ABSTRACT

A device includes first to third power/ground (PG) elements; a first set of at least three tracks between the first and second PG elements and a second set of at least three tracks between the second and third PG elements, the tracks being arranged in equal numbers between the first and second PG and second and third PG elements; a first row of cells overlapping the first set; and a second row of cells overlapping the second set. In the first row of cells, a first cell has a first height and a second cell has a greater height than the first height; in the second row of cells, a third cell has the first height and a fourth cell has a lesser height less than the first height; and a track configured as an in-cell PG track is aligned with a boundary of the second and fourth cells.

20 Claims, 29 Drawing Sheets

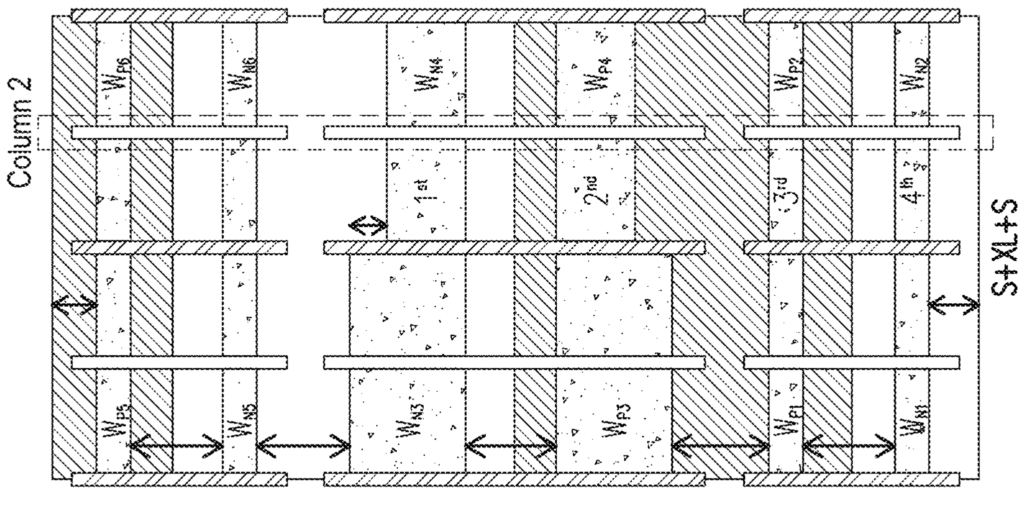
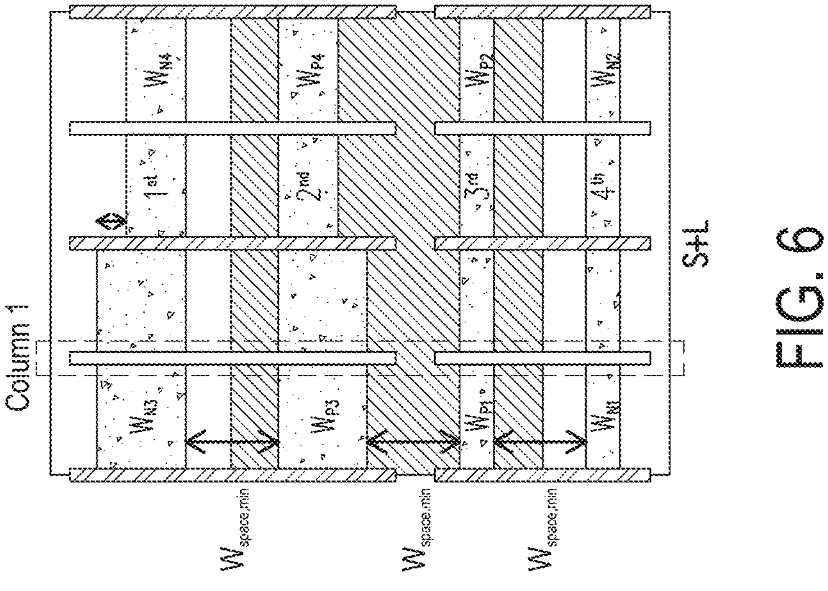
FIG. 6
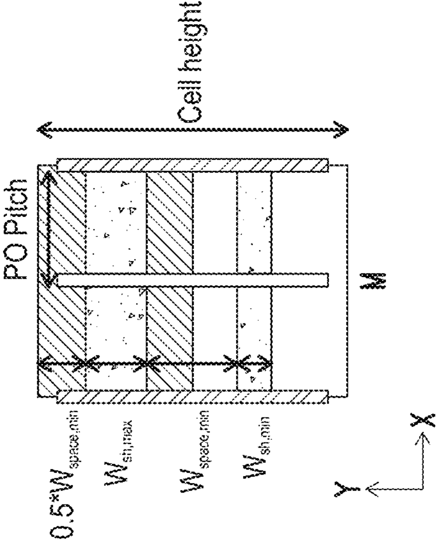

COMPATIBLE HYBRID-CELL STRUCTURE, DEVICE HAVING THE SAME, AND METHOD

BACKGROUND

A device such as a semiconductor device may have a structure that is laid out on the basis of functional cells. A simple layout may use cells having uniform sizes, e.g., uniform cell heights. Such a layout may be simple to design but may result in a relatively large device, e.g., a device having a large die size, and may thus exhibit relatively low PPA (power, performance, and area) characteristics. Another layout may use cells having more than one size, e.g., more than one cell height, which may enable design of a relatively smaller device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is an illustration of examples of front end of line (FEOL) structures according to some embodiments.

DETAILED DESCRIPTION

Figure 1:
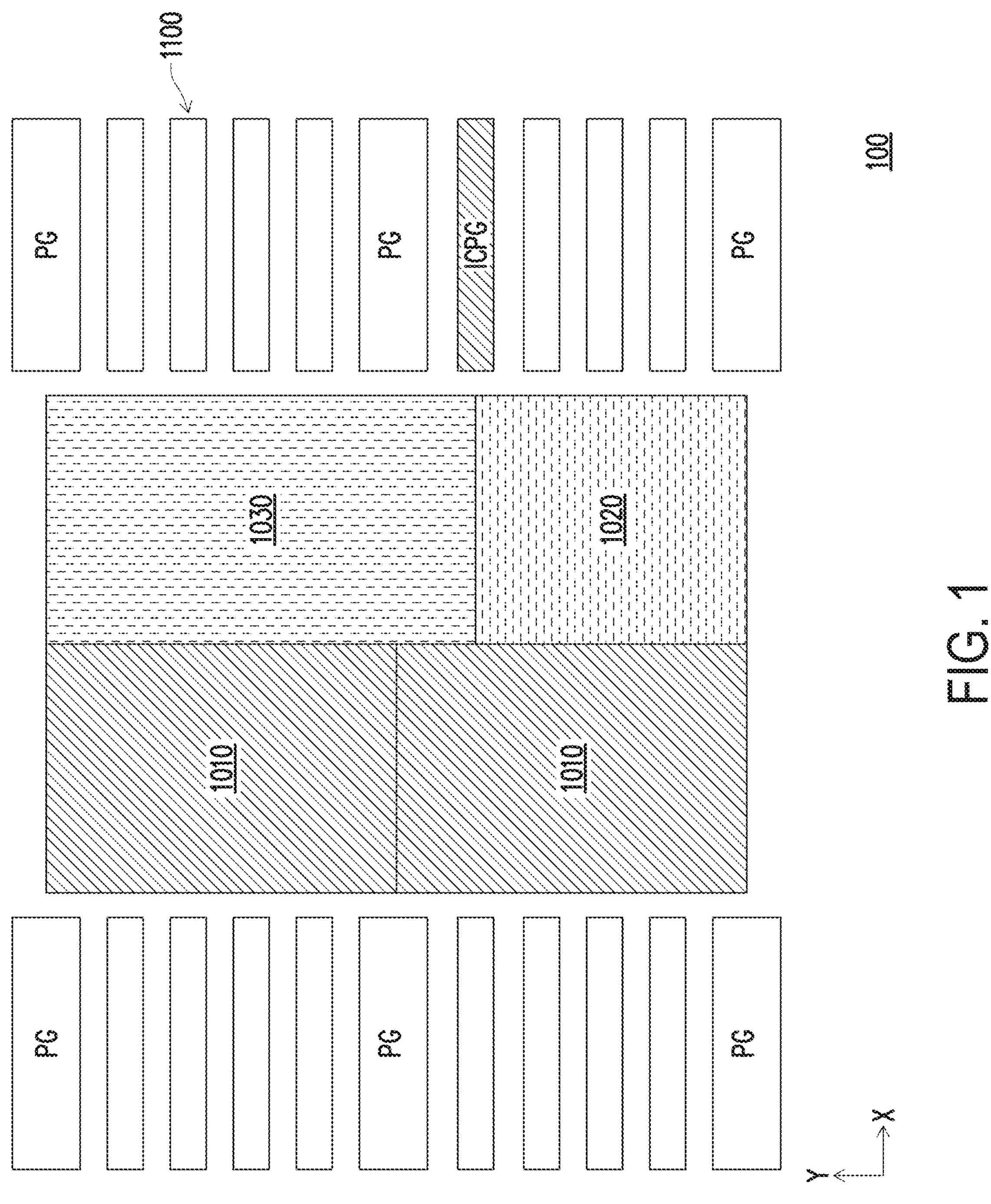
FIG. 1 is an illustration of an example layout for a compatible hybrid-cell structure according to an embodiment.

This disclosure describes embodiments and examples of the subject matter set forth herein and, although specific examples of components, materials, values, steps, arrangements, or the like may be described, such examples are not limiting and other components, materials, values, steps, arrangements, or the like are contemplated.

As used herein, a term preceded by "a" or "an" (and "the" when antecedent basis is "a" or "an") indicates both singular and plural of such term, unless indicated otherwise.

Further, like numbers are intended to denote like elements throughout this disclosure and the drawings, but like numbers or other referential descriptors do not imply a specific hierarchy or order. Likewise, references to "first," "second," "third," or the like do not imply a specific order.

Further, a description of a first element being "on" a second element may include a case in which the first element is directly on the second element, i.e., the first and second elements are in direct contact, and may also include a case in which an additional element is between the first and second elements, e.g., a case in which the first and second elements are not in direct contact.

Further, the terms "comprises," "comprising." "includes," "including," "has," "having." and variations thereof indicate a non-exclusive inclusion. For example, a process, article, or apparatus that "comprises" a list or set of stated elements is not limited to only the stated elements, and may include other elements not expressly listed or stated.

Further, the term "or" is inclusive, not exclusive, such that the term "or" means "and/or" unless indicated otherwise. Thus, "A or B" means "A and/or B" and encompasses A alone, B alone, and both A and B, unless indicated otherwise.

Further, spatially relative terms, such as "beneath," "below," "lower," "above." "upper" and the like, may be used herein for ease of description to describe one element or feature's relationship to another element(s) or feature(s) as illustrated in the figures but do not imply a fixed orientation. The spatially relative terms are intended to encompass different orientations in addition to the orientation depicted in the figures.

Further, "source/drain(s)" may refer to a source or a drain, individually or collectively dependent upon the context.

In some embodiments, a device includes first to third power/ground (PG) elements. The device includes a first set of at least three tracks between the first and second PG elements and a second set of at least three tracks between the second and third PG elements, the tracks being arranged in equal numbers between the first and second PG and second and third PG elements. The device includes a first row of cells overlapping the first set, and a second row of cells overlapping the second set. In the first row of cells, a first cell has a first height and a second cell has a greater height than the first height. In the second row of cells, a third cell has the first height and a fourth cell has a lesser height less than the first height. The device includes a track configured as an in-cell PG track and aligned with a boundary of the second and fourth cells. In some embodiments, a boundary between vertically-adjacent cells corresponds to a power or ground element or an in-cell power or ground element.

In some embodiments, an integrated circuit and/or a layout corresponding to the same includes a variety of cells of different cell heights. In some embodiments, the variety of cells of different heights allows for greater flexibility in laying out circuits. An integrated circuit and/or layout according to some embodiments provides benefits associated with the use of rows having respectively different cell heights while also being compatible with layout elements that use cells of uniform cell heights in adjacent rows.

FIG. 1 is an illustration of an example layout for a compatible hybrid-cell structure according to an embodiment.

Referring to FIG. 1, an example layout 100 includes cells having a first cell height and cells having cell heights that are different from the first cell height. In some embodiments, each cell is used as a standard cell in a library of standard cells. In some embodiments, the cells are used for finFET transistors and include fin patterns that extend substantially parallel to a horizontal or X axis in FIG. 1. In some embodiments, nanosheets extend substantially parallel to the X axis in FIG. 1.

In FIG. 1, cells 1010 have the first cell heights, and cells 1020 and 1030 have cell heights that are different from the first cell height. Herein, the cells 1010 are also referred to as having a medium cell height, the cell 1020 is also referred to as having a small cell height, and the cell 1030 is also referred to as having a large cell height. In some cases, for brevity, the cells 1010 are referred to as medium cells, the cells 1020 are referred to as small cells, and the cells 1030 are referred to as large cells. The terms medium, small, and large merely describe relative heights, relative to each other.

In some embodiments, a boundary between vertically-adjacent cells (e.g., a boundary, parallel to the X axis, between the two cells 1010 in FIG. 1, or a boundary, parallel to the X axis, between the cell 1030 and the cell 1030) corresponds to a power or ground element or an in-cell power or ground element. In some embodiments, a boundary between vertically-adjacent cells is aligned with a middle of a width of the power or ground element or the in-cell power or ground element, the width being determined in a vertical dimension (parallel to a vertical or Y axis in FIG. 1).

FIG. 1 includes power/ground (PG) rails and tracks 1100. In some embodiments, the PG rails and the tracks 1100 extend parallel to the X axis. In some embodiments, as described in further detail below in connection with, e.g., FIGS. 9, 10A, 11A-11B, 12A-12B, and 13A-13B, the PG rails extend along a plurality of cells while the tracks 1100 extend within cells. In some embodiments, the tracks 1100 do not extend into a laterally adjacent cell.

In some embodiments, the PG rails and the tracks 1100 are electrically conductive. In some embodiments, the PG rails and the tracks 1100 are formed of a metal or another electrically conductive material.

In some embodiments, the PG rails are used to provide power to circuits that are in the cells. In some embodiments, the PG rails are part of a power grid that provides power to the device. For example, in some embodiments, the PG rails are used to provide a first supply voltage and a second supply voltage, e.g., a first constant supply voltage and a second constant supply voltage. For example, in some embodiments, the PG rails are used to provide power and ground, VSS and VDD, or the like. In some embodiments, the tracks 1100 are used to provide signals, e.g., control signals, to circuits formed in the cells.

In FIG. 1, the medium cells 1010 each overlap two of the PG rails. In FIG. 1, each of the medium cells 1010 also overlaps all of the tracks 1100 between each adjacent pair of PG rails.

In some embodiments, one or more of the tracks 1100 are used as an in-cell power/ground (ICPG) track. In some embodiments, the ICPG track is used to provide power to circuit elements, e.g., transistors or the like, that are in the cells. In some embodiments, the ICPG track is part of the power grid. For example, in some embodiments, the ICPG track is used to provide a first supply voltage or a second supply voltage, e.g., a first constant supply voltage or a second constant supply voltage. For example, in some embodiments, the ICPG track is used to provide power or ground, VSS or VDD, or the like.

In some embodiments, referring to FIG. 1, the ICPG track is directly adjacent to a PG rail. In other embodiments (described below but not shown in FIG. 1), the ICPG track is non-adjacent to a PG rail, i.e., a track 1100 other than the ICPG track (e.g., a sandwiched track 1100) is interposed between the PG rail and the ICPG track.

In FIG. 1, the small cell 1020 overlaps only one PG rail. In some embodiments, the small cell 1020 overlaps, e.g., at a top or bottom extent of the small cell 1020, with the ICPG track. In some embodiments, the ICPG track of the small cell 1020 is connected to a PG rail using various structures, examples of which are described herein.

In some embodiments, various cells include active devices such as transistors that receive power, e.g., power or ground, from the PG rails and/or the ICPG tracks. For example, in some embodiments, the small cell 1020 includes a transistor, and the ICPG track of FIG. 1 is electrically connected to a source or a drain of the transistor. In some embodiments, the large cell 1030 includes a first transistor having a source connected to the ICPG track and the small cell 1020 includes a second transistor having a source connected to the ICPG track. In some embodiments, the first transistor and the second transistor each receive power from the ICPG track, the power from the ICPG track being supplied by the PG rail.

In FIG. 1, the small cell 1020 overlaps all of the tracks 1100 between adjacent PG rails; however, in other embodiments, the small cell 1020 overlaps fewer than all of the tracks 1100 between adjacent PG rails. For example, in some embodiments, the small cell 1020 has a non-adjacent ICPG track (described further below) and a top or bottom extent of the small cell 1020 corresponds to the non-adjacent ICPG track.

In FIG. 1, the large cell 1030 overlaps two of the PG rails, all of the tracks 1100 between the two PG rails, and an additional track, i.e., the ICPG track.

In FIG. 1, the large cell 1030 is shown as overlapping an adjacent ICPG track; however, in other embodiments, the large cell 1030 overlaps more than one additional track, e.g., one or more sandwiched tracks 1100 and a non-adjacent ICPG track.

In some embodiments, the PG rails are uniformly spaced and have a same pitch throughout the layout 100. In some embodiments, the PG rails are separated by a constant number of tracks 1100 throughout the layout 100, i.e., in some embodiments, a total number of tracks 1100 between each pair of adjacent PG rails is constant. In some embodiments, this includes a case where a track 1100 is used as an ICPG track. For example, FIG. 1 includes a total of four tracks 1100 between each pair of adjacent PG rails, including one case where three tracks 1100 and one ICPG track are between a pair of adjacent PG rails.

The constant number of tracks 1100 in the layout 100 may be viewed in terms of a number of tracks per row of cells. In some embodiments, the layout 100 has cells (e.g., medium cells 1010) that are arranged in rows in the layout 100. In some embodiments, each row has a same number of tracks 1100.

Figure 2:
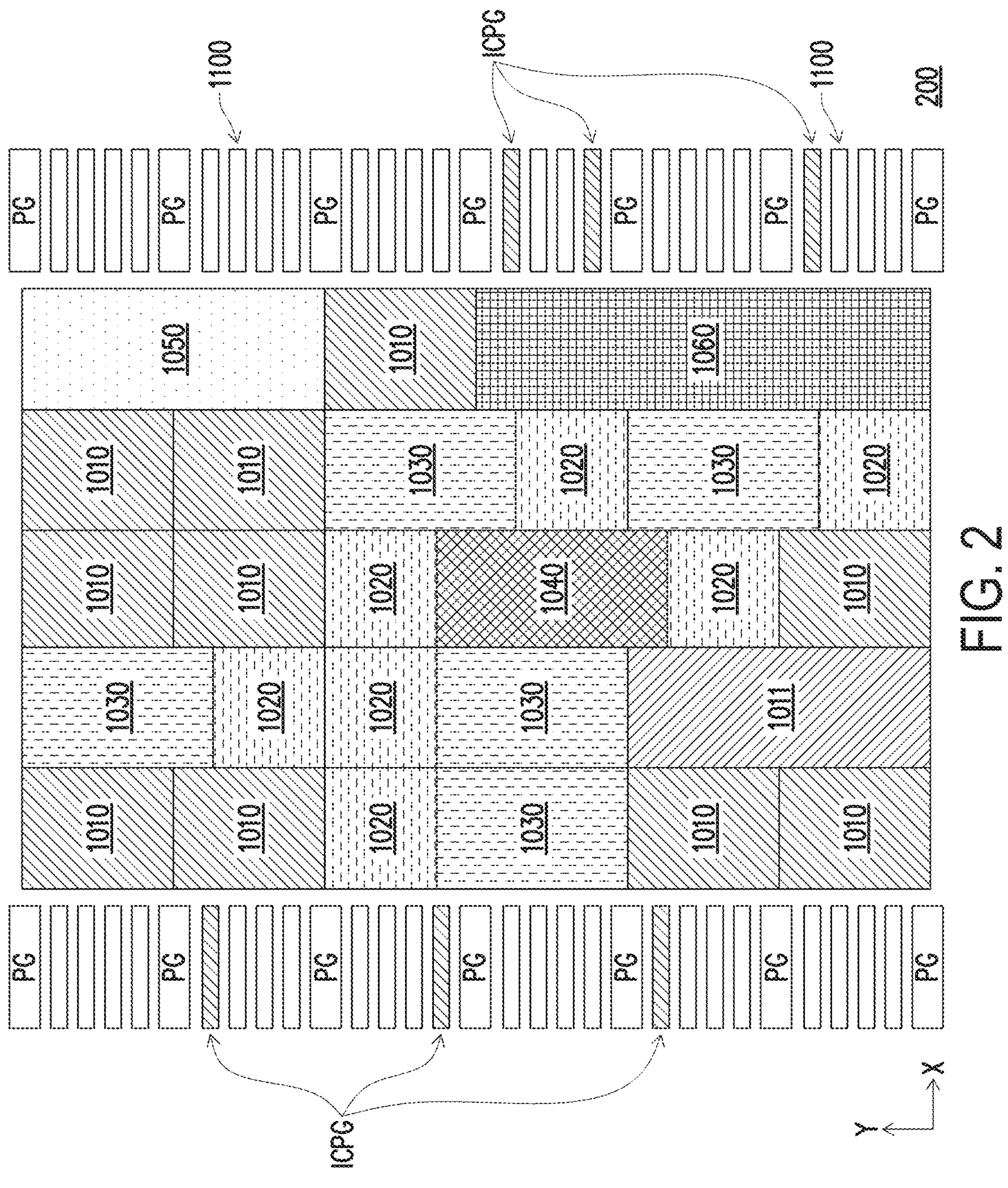
FIG. 2 is an illustration of another example layout for a compatible hybrid-cell structure according to an embodiment.

FIG. 2 is an illustration of another example layout for a compatible hybrid-cell structure according to an embodiment.

In FIG. 2, an example layout 200 includes cells having the first cell height and cells having cell heights that are different from the first cell height, as in FIG. 1. In FIG. 2, the medium cells 1010 have the first cell heights, and the small cells 1020 and the large cells 1030 have cell heights that are different from the first cell height, as in FIG. 1.

In some embodiments, a combined height of one cell 1020 having the small height and one cell 1030 having the large height is the same as a double-height of the medium cell 1010, i.e., the same as a combined height of two cells 1010 having the medium cell height.

A cell 1040 in FIG. 2 may be referred to as having an extra-large cell height. For brevity, herein the cell 1040 having the extra-large cell height may be referred to as an extra-large cell. The terms medium, small, large, and extra-large describe heights relative to each other.

In some embodiments, the variety of different cells (i.e., the variety of cells of different cell heights) allows for greater flexibility in the layout of circuits. In some embodiments, this greater flexibility enables performance improvements, e.g., greater speed, lower power consumption, and/or reduced circuit or die area. For example, in some embodiments the small cells 1020 enable circuit elements that exhibit relatively power consumption, the medium cells 1010 enable general driving coverage with relatively modest area requirements, and the large cells 1030 and the extra-large cells 1040 enable relatively greater speeds. In some embodiments, a variety of cell heights are implemented in the layout 200 to enable circuit designs with an overall enhanced PPA from more driving coverage.

In FIG. 2, some cell heights of the above-described cells are combined. For example, a double-medium height cell 1011 is included in FIG. 2. Also, FIG. 2 includes a cell 1050 having a cell height that corresponds to combined cell heights of one small cell 1020 and one large cell 1030, i.e., large+small, and is referred to as a double cell (i.e., double the height of the medium cell 1010). Also, FIG. 2 includes a cell 1060 having a cell height that corresponds to combined cell heights of one small cell 1020, one extra-large cell 1040, and one more small cell 1020, i.e., small+extra-large+small. The cell height of the cell 1060 corresponds to a triple-height of the medium cell 1010 (i.e., the cell 1060 has a cell height that corresponds to combined cell heights of three medium cells 1010) and the cell 1060 is referred to as a triple cell. It will be appreciated that the terms medium, small, large, and extra-large describe heights relative to each other.

In FIG. 2, each of the medium cells 1010 overlaps two of the PG rails and each of the medium cells 1010 also overlaps all of the tracks 1100 between each adjacent pair of PG rails, as in FIG. 1. Also in FIG. 2, as in FIG. 1, the small cell 1020 overlaps only one PG rail, and the large cell 1030 overlaps two of the PG rails, all of the tracks 1100 between those two PG rails, and an additional track. The large cell 1030 overlaps more than one additional track.

In FIG. 2, the extra-large cell 1040 overlaps two of the PG rails, all of the tracks 1100 between those two PG rails, and two additional tracks, i.e., two ICPG tracks. In some embodiments, the extra-large cell 1040 overlaps more than two additional tracks.

In some embodiments, the double cell 1050 and the triple cell 1060 each have a cell height that corresponds to a spacing of more than two PG rails, e.g., three PG rails for the double cell 1050 and four PG rails for the triple cell 1060.

The layout 200 includes cells that have a cell height corresponding to a spacing of PG rails, a spacing of a PG rail and an ICPG track, and a spacing of two ICPG tracks.

In the layout 200, each adjacent pair of PG rails have a same number of tracks 1100 therebetween, some of which are designated as ICPG tracks. FIG. 2 illustrates four tracks, either tracks 1100 or a combination of tracks 1100 and ICPG tracks, between each adjacent pair of PG rails. The layout 200 shows four tracks merely for the sake of description; the number of tracks is not limited to four.

In some embodiments, the PG rail and/or the tracks 1100 are formed in a lowermost conductive material layer over a substrate. In some embodiments, the lowermost conductive material layer over the substrate is a first metal layer or metal layer zero (M0).

In some embodiments, at the M0 layer, a same number of M0 tracks is between all of the PG rails. As described below, in some embodiments, some M0 tracks are connected to the power/ground grid to serve as ICPG tracks.

Figure 3:
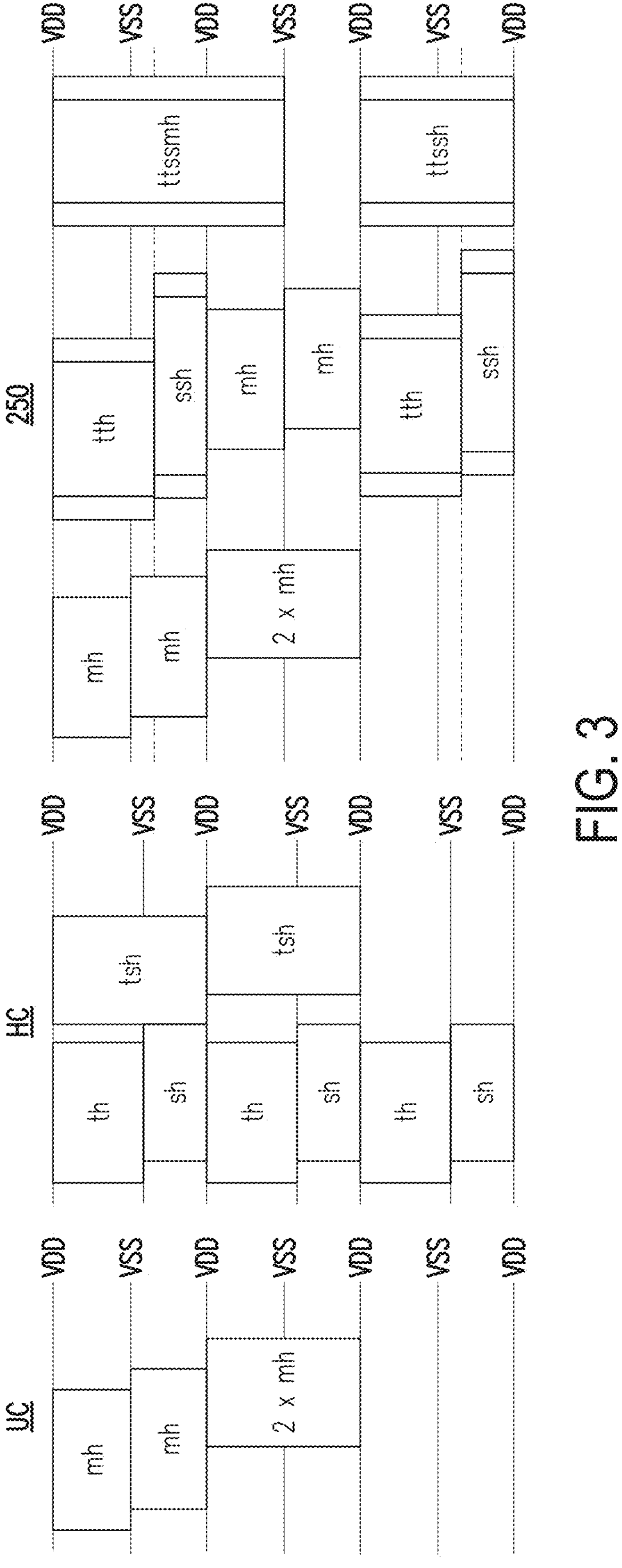
FIG. 3 is an illustration of aspects of a layout according to an embodiment relative to a layout having uniform-height cells and a layout having hybrid-height cells.

FIG. 3 is an illustration of aspects of a layout according to an embodiment relative to a layout having uniform-height cells and a layout having hybrid-height cells.

FIG. 3 is an illustration of an example layout 250, which shares aspects of the layouts 100 and 200, relative to a layout UC having uniform-height cells and a layout HC having hybrid-height cells.

By way of review, another approach to a layout design uses a series of rows of cells in which all cells in all rows have uniform cell heights, with all rows having a same number of tracks per row. This may be referred to as a uniform-cell layout UC. In an example of the uniform-cell layout UC, power rails, e.g., rails providing VDD and VSS, are uniformly spaced throughout the layout. In an example, a layout using the uniform-cell row design is formed using, e.g., all mid-height cells (mh), all tall-height cells (th), or all short-height cells (sh), such that each row of the layout has cells that are the same cell height, e.g., all rows are all mid-height cells, all rows are all tall-height cells, or all rows are all short-height cells. By way of example, FIG. 3 illustrates the uniform-cell layout UC having the mid-height cells (mh), including a double-mid-height cell (2×mh). Using characteristics of the mid-height cells by way of reference, the layout using the tall cells may enable relatively enhanced speed while occupying relatively greater area. The greater area is undesirable in some cases due to the possibility of an overall greater die size. On the other hand, again using the mid-height cells as a reference, the layout using the short cells may enable a relatively smaller area while providing relatively less speed.

A second general approach to a layout design uses rows having cells of uniform cell height within each row but with different rows having respectively different cell heights, and having respectively different active region widths and/or numbers of tracks for rows of different heights, also referred to as a hybrid-cell layout HC. In an example of the hybrid-cell layout HC, the power rails, e.g., rails providing VDD and VSS, are spaced apart by a first distance or a second distance that is different from the first distance. In an example, a layout using the hybrid-cell row design is formed using rows having different cell heights, e.g., an alternating arrangement of rows in which tall-height cells (th) and short-height cells (sh) alternate by row while, within each row, all cells have the same height. By way of example, FIG. 3 illustrates the layout HC having the tall-height cells (th) in alternating rows, having the short-height cells (sh) in alternating rows, and having a multiple-height cell (tsh) with a cell height corresponding to a combined height of one tall-height cell (th) and one short-height cell (sh). In an example of the hybrid-cell layout HC, alternating rows of different cell heights are provided in which a first row having a greater height has a first number of tracks and a second row having a lesser height has a second number of tracks that is less than the first number of tracks, and rows having the first number of tracks and the second number of tracks alternate. Relative to the uniform-cell row design, the hybrid-cell row design in some embodiments allows for circuit designs or layouts having greater speed in a smaller area.

On the other hand, in some embodiments, in a layout 250, aspects of the above-noted first and second general approaches may be used together. In some embodiments, in the layout 250 a series of rows each has a same number of tracks (see examples of the tracks 1100 in FIGS. 1 and 2) while having cells of different cell heights. In the layout 250, the power rails, e.g., rails providing VDD and VSS, are uniformly spaced throughout the layout, e.g., in the same manner as in the uniform-cell row layout UC in FIG. 3, and the power rails providing VDD and VSS are spaced apart in a height direction of the cells by a spacing that corresponds to a height of a base cell, e.g., a mid-height cell (mh). In some embodiments, the layout 250 thus also accommodates the double-mid-height cell (2×mh).

In addition, in some embodiments, the layout 250 has cells with cell heights greater than and/or less than the cell height of the mid-height cells, and which have a cell height that is not an integer multiple of the mid-height cells. For example, in some embodiments, the layout 250 includes cells with cell heights corresponding to the tall-height cells (th) and the short-height cells (sh) of the hybrid-cell row layout HC, although it may be more advantageous to include even taller and even shorter cells in the layout 250, e.g., the layout 250 may include a taller-height cell (tth) having a cell height that is greater than that of the tall-height cell (th), and a shorter-height cell (ssh) having a cell height that is less than that of the short-height cell (sh). In some embodiments, the taller-height cell (tth) has a cell height that is less than twice the height of the mid-height cell (mh). In some embodiments, the shorter-height cell (ssh) has a cell height that is less than the cell height of the mid-height cell (mh).

In some embodiments, as described in connection with FIGS. 1 and 2, one or more of the tracks 1100 are used as an in-cell power/ground (ICPG) track, and the ICPG track corresponds to a location where a taller-height cell (tth) and a shorter-height cell (ssh) meet. For example, in some embodiments, a conductive track located along the horizontal dashed line in the layout 250 of FIG. 3 is designated as an ICPG track, and power is provided from the power rail providing VSS to the ICPG track for the shorter-height cell (ssh). In some embodiments, cells having cell heights corresponding to combinations of cell heights are also used, e.g., a cell (ttssmh) having a cell height corresponding to a combined height of a taller-height cell (tth), a shorter-height cell (ssh), and a mid-height cell (mh) as shown in the layout 250 and/or, e.g., a cell (ttssh) having a cell height corresponding to a combined height of a taller-height cell (tth) and a shorter-height cell (ssh).

In some embodiments, the layout 250, like the layouts 100 and 200, may provide the benefits associated with the use of rows having the respectively different cell heights, as in the layout HC, while also being compatible with layout elements that use cells of uniform cell heights in adjacent rows, as in the layout UC. In some embodiments, the layout 250 enables layouts or circuit designs that are closer to an ideal design. Thus, for example, the layout 250, like the layouts 100 and 200, may provide for PPA enhancement by providing more driving coverage. Additionally, the layout 250, like the layouts 100 and 200, may allow for the use of cells (ssh) having shorter cell heights than the short-height cells (sh) of the layout HC.

By way of a specific example, a D flip-flop with scan input (SDFQ) circuit may be formed using the uniform-cell layout UC, the hybrid-cell layout HC, and the layout 250. The SDFQ may include a plurality of devices, some of which may be said to be in a critical path and others of which are not in the critical path. The SDFQ formed using the layout HC may have better overall PPA than the SDFQ formed using the layout UC, e.g., a speed/area ratio may be better for the layout HC than for the layout UC. Nonetheless, the layout HC may present some difficulties, e.g., when a given device in the critical path is formed in a short-height cell (sh) rather than a tall-height cell (th) due to, e.g., routing requirements that make placement of the given device in the tall-height cell difficult, and thus the given device may be formed to include, e.g., a one-fin transistor (finFET) rather than a more preferable two-fin transistor. Such a row constraint may result in a dragging effect on device performance, e.g., a decrease in speed or an increase in power consumption and/or area. On the other hand, the layout 250 may provide a greater number of cell height options for optimizing the critical path (compare the single cell height of the mid-height cell (mh) of the layout UC and the two cell heights of the tall-height cells (th) and short-height cells (sh) of the layout HC to the three cell heights of the mid-height cells (mh), the taller-height cells (tth), and the shorter-height cells (ssh) of the layout 250, and note that the taller-height cells (tth) of the layout 250 may improve cell driving coverage relative to the tall-height cell (th) of the layout HC), which may be advantageous in terms of cell height selection and/or routing connections, e.g., M0 routing connections. Also, in some embodiments, the layout 250 enables the use of a cell grouping approach as compared to the use of row-based approaches used for the layout UC and the layout HC.

Again by way of a specific example, the layout UC may be designed to have four M0 tracks between each pair of adjacent PG rails (e.g., a set of four M0 tracks between each adjacent pair of VDD and VSS rails in FIG. 3), the layout HC may be designed to have alternating sets of four M0 tracks and three M0 tracks between each pair of adjacent PG rails (e.g., a set of four M0 tracks between VDD and VSS (for tall-height cells (th)), and a set of three M0 tracks between VSS and VDD (for short-height cells (sh) in FIG. 3), and the layout 250 may be designed to have four M0 tracks between each pair of adjacent PG rails (e.g., a set of four M0 tracks between each adjacent pair of VDD and VSS rails in FIG. 3). In the layout HC, a cell height may be enlarged relative to the layout UC (i.e., the tall-height cell (th) of the layout HC may be taller than the mid-height cell (mh) of the layout UC) but this is accompanied by a cell of decreased height in the layout HC (the short-height cell (sh)) with a lesser number of M0 tracks (three), with the entire row of short-height cells (sh) having the lesser number of M0 tracks (three). On the other hand, in some embodiments, in the layout 250, a cell of decreased height, i.e., the shorter-height cell (ssh), is provided with its own ICPG track such that adjacent cells in the row direction need not be limited to a lesser number of tracks. Thus, whereas the layout HC has entire rows of short-height cells (sh), the layout 250 allows for cells of decreased height to be intermixed with cells having other heights and attendantly greater numbers of tracks 1100. This is described in further detail below in connection with FIGS. 2Y and 5.

Figure 4A:
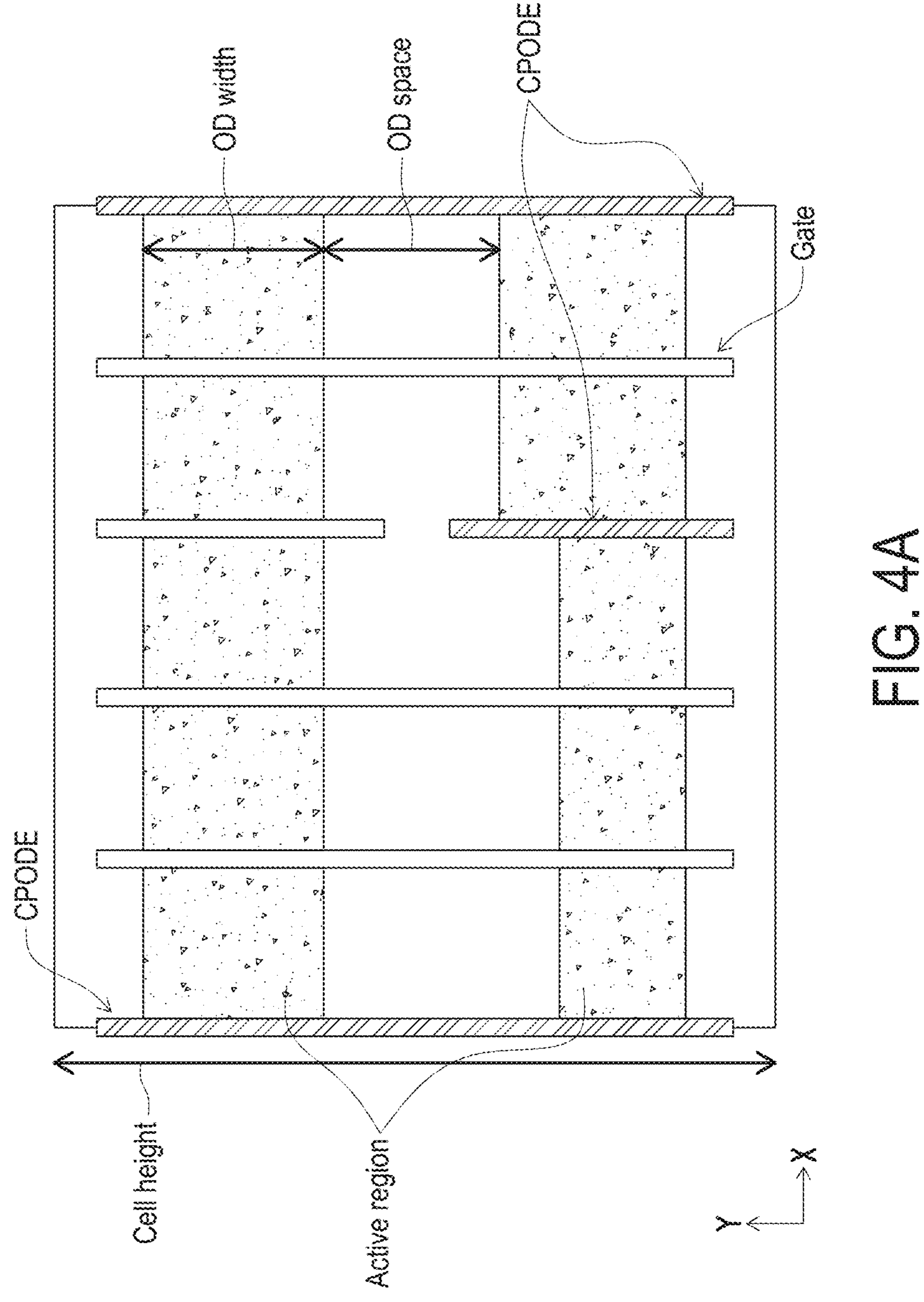
FIGS. 4A and 4B are illustrations of aspects of cells in a layout according to some embodiments.
Figure 4B:
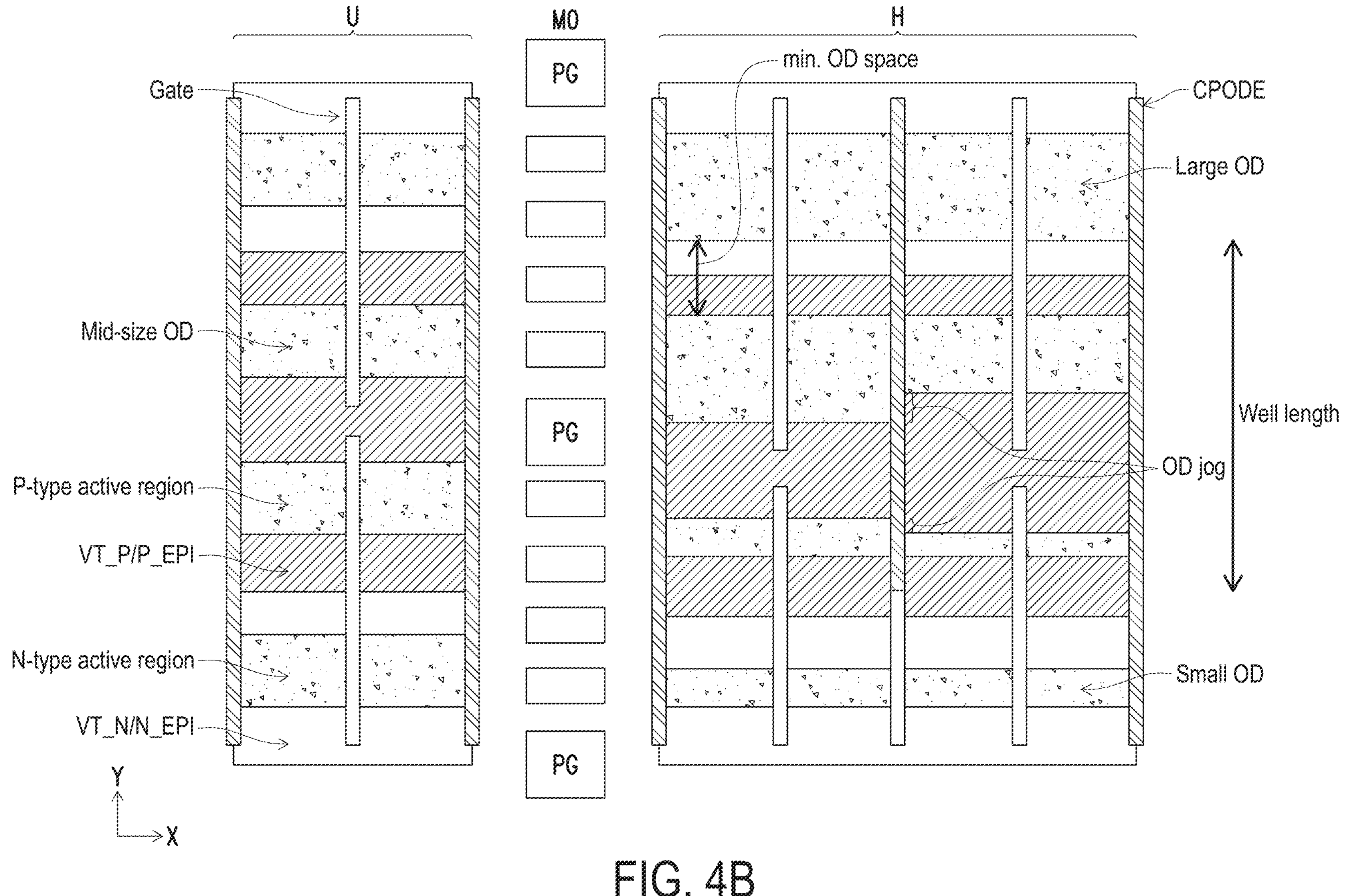

FIGS. 4A and 4B are illustrations of aspects of cells in a layout according to some embodiments.

In some embodiments, referring to FIGS. 4A and 4B, a cell height is defined in a vertical dimension (parallel to the Y axis in FIG. 2Y). In some embodiments, in the cell, active regions, e.g., N-type active regions and P-type active regions, are referred to as oxide definition (OD) regions. In some embodiments, an active region has a height in the vertical dimension that is defined as an OD width, i.e., the measurement of the OD width is determined in the vertical dimension, i.e., parallel to the Y axis, and the active region extends along a row direction, i.e., parallel to the X axis. In some embodiments, active regions are separated by an OD space (here, the measurement of the OD space is determined in the vertical dimension, i.e., parallel to the Y axis). In some embodiments, the cell height is equal to 2*(max OD width+min OD space). Another way of describing this relationship is that the OD width may be limited by the cell height, if the cell height is set or predefined.

In some embodiments, active regions in laterally adjacent cells are isolated from one another by an isolation pattern. In some embodiments, the isolation pattern is a continuous polysilicon on oxide definition edge (CPODE) pattern. In some embodiments, isolation patterns in two adjacent rows are aligned with one another parallel to the Y axis.

In some embodiments, lateral boundaries of the cell are defined by a CPODE pattern.

In FIG. 4B. 'U' indicates a cell structure in layout having uniform-height cells and 'H" indicates a cell structure in a layout having hybrid-height cells. As shown in the cell structure 'H' in FIG. 4B, in some embodiments, an in-cell OD width is changed, e.g., to tune performance, at a CPODE. In some embodiments, a nanosheet structure is used that changes OD width at the location of a CPODE. In some embodiments, the addition of an extra CPODE increases cell area.

It will be appreciated that, in general, OD width may dominate the cell PPA, and a larger OD width may bring higher speed/energy/leakage (e.g., speed and switching energy may increase with increasing OD width, and leakage power and speed may increase with increasing OD width).

Figure 5:
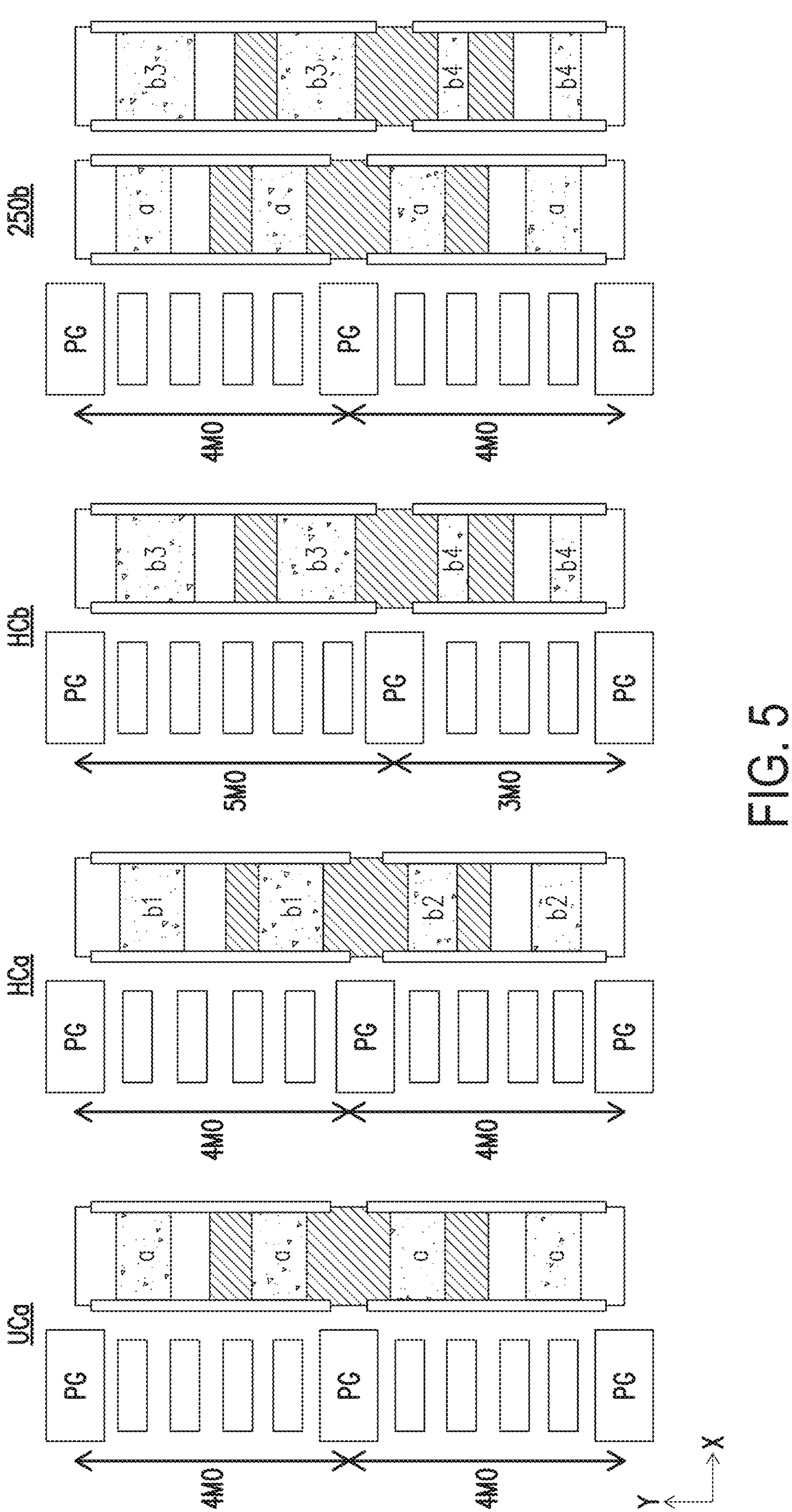
FIG. 5 is an illustration of cells in various layouts according to some embodiments.

FIG. 5 is an illustration of cells in various layouts according to some embodiments.

Referring to FIG. 5, a layout UCa having uniform-height cells is shown as having four M0 tracks, by way of example. In the layout UCa, all the cells are shown as having a same OD width of 'a', i.e., the widths of the active regions along the Y axis are all 'a'.

FIG. 5 includes first and second layouts HCa and HCb having cells of uniform cell height within each row but with different rows having respectively different active region widths (OD widths) (layout HCa), or respectively different OD widths and respectively different numbers of tracks per row (layout HCb).

FIG. 5 also includes a layout 250*b* according to an embodiment, in which different rows have a same number of tracks per row (4 M0 tracks per row are shown for the layout 250*b*, by way of example) but have different OD widths.

It will be appreciated that the layouts shown in FIG. 5 show various numbers of tracks and various OD widths merely for the sake of description, and the layouts are not limited to the number of tracks or OD widths that are shown.

In the layout UCa having uniform-height cells, each cell overlaps four M0 tracks and each cell has active regions with the same OD width ('a').

In a similar manner to the layout UCa, the layout 250*b* has four M0 tracks and includes cells having the OD width 'a'.

In the layouts HCa and HCb, some OD widths vary by row (OD widths 'b1' and 'b2' in the rows of layout HCa, and OD widths 'b3' and 'b4' in the rows of layout HCb). The OD width 'b1' of layout HCa may be greater than the OD width 'a' of the layout UCa, and the OD width 'b2' of the layout HCa may be less than the OD width 'a' of the layout UCa. The OD width 'b3' of layout HCb may be greater than the OD width 'b1' of the layout HCa, and the OD width 'b4' of the layout HCb may be less than the OD width 'b2' of the layout HCa.

In a similar manner to the layouts HCa and HCb, in some embodiments the layout 250*b* has cells of varying OD widths. In some embodiments, the layout 250*b* includes the cells having the OD width 'a', as discussed above, and further includes cells having the OD widths 'b3' and 'b4'. Thus, in some embodiments, the layout 250*b* has cells with OD widths that correspond to both the layout UCa and the layout HCb, but whereas the layout HCb has 3 M0 tracks for the entire row of cells with the OD width 'b4', the layout 250*b* may use an M0 track as an ICPG track on a cell-by-cell basis, and thus a cell with the OD width 'b4' in the layout 250*b* may be adjacent, in a row direction, to cells of greater OD width (e.g., 'a') that have more M0 tracks (e.g., four M0 tracks).

In some embodiments, in the layout 250*b*, a sum of the dimensions (parallel to the Y axis) of two OD widths 'b3' and two OD widths 'b4' is equal to, or less than, a sum of the dimensions (parallel to the Y axis) of four OD widths 'a'. Also, with reference to the layout 250*b* and FIG. 2, in some embodiments the triple cell 1060 of FIG. 2 has a sum of OD widths (as measured parallel to the Y axis direction) that is equal to, or less than, six times the OD width 'a' in the layout 250*b* (as described above, the triple cell 1060 may have a cell height that corresponds to combined cell heights of three medium cells 1010).

FIG. 6 is an illustration of examples of front end of line (FEOL) structures according to some embodiments.

FIG. 6 is an illustration of examples of front end of line (FEOL) structures for a single-height structure ('M'), a double-height structure ('S+L'), and a triple-height structure ('S+XL+S').

Referring to FIG. 6, a cell height is shown for the single-height structure ('M'); this cell height may be referred to as a standard cell height.

In some embodiments, the standard cell height is equal to $2^*(W_{sh,max}+W_{space,min})$. In some embodiments, the minimum OD space ($W_{space,min}$) may be set according to a process, and may be set as a minimum OD space for all cells in the layout. In some embodiments, a minimum OD width $W_{sh,min}$ may be a minimum width that satisfies a design rule of a process.

If the standard cell height is fixed and the minimum OD space ($W_{space,min}$) is set by a process, it will be appreciated that the OD width in the standard cell can be no more than $W_{sh,max}$ if the following is true: standard cell height=$2^*(W_{sh,max}+W_{space,min})$.

In the double-height structure ('S+L') and the triple-height structure ('S+XL+S'), the OD width distributions may vary while the minimum OD space remains constant. In some embodiments, the maximum OD width in the double-height structure and/or the triple-height structure is larger than $W_{sh,max}$ in the single-height structure. For example, $W_{N3}$ and $W_{P3}$ in the double-height structure and/or the triple-height structure in FIG. 6 are larger than $W_{sh,max}$ in the single-height structure in FIG. 6. In some embodiments, increases to $W_{N3}$ and $W_{P3}$ are accompanied by decreases in $W_{N1}$ and $W_{P1}$. In some embodiments, $W_{N1}$ and $W_{P1}$ in the double-height structure and/or the triple-height structure in FIG. 6 are smaller than $W_{sh,max}$ in the single-height structure in FIG. 6.

In the triple-height structure ('S+XL+S'), the XL portion may have maximum OD widths that are constrained by the four minimum OD widths of the S portions. That is, the OD widths may be distributed among the two S and one XL portions so as to maximize the OD widths in the XL portion while maintaining a minimum OD width in the two S portions. That is, referring to Column 2 in the triple-height structure ('S+XL+S'), the triple-height structure may have a sum of OD widths (as measured parallel to the Y axis direction) that is equal to, or less than, six times the single-height structure's maximum OD width (six times $W_{sh,max}$). In some embodiments, N-type active regions and P-type active regions have widths that are different from each other, e.g., the widths of $W_{N4}$ and $W_{P4}$ may be different from each other in the triple-height structure ('S+XL+S').

Also, a maximum same-column OD width sum may be fixed. For example, referring to Column 1 in the double-height structure ('S+L'), the following relationship may be true:

$$W_{N1} + W_{P1} + W_{P3} + W_{N3} \le 4 * W_{sh,max}$$

Referring to Column 2 in the triple-height structure ('S+XL+S'), some embodiments satisfy the following relationship:

$$W_{N2} + W_{P2} + W_{P4} + W_{N4} + W_{P6} + W_{N6} \le 6 * W_{sh,max}$$

In FIG. 6, various OD widths may change (or jog) at a CPODE pattern, a poly (PO) pattern, or by active region.

Figure 7:
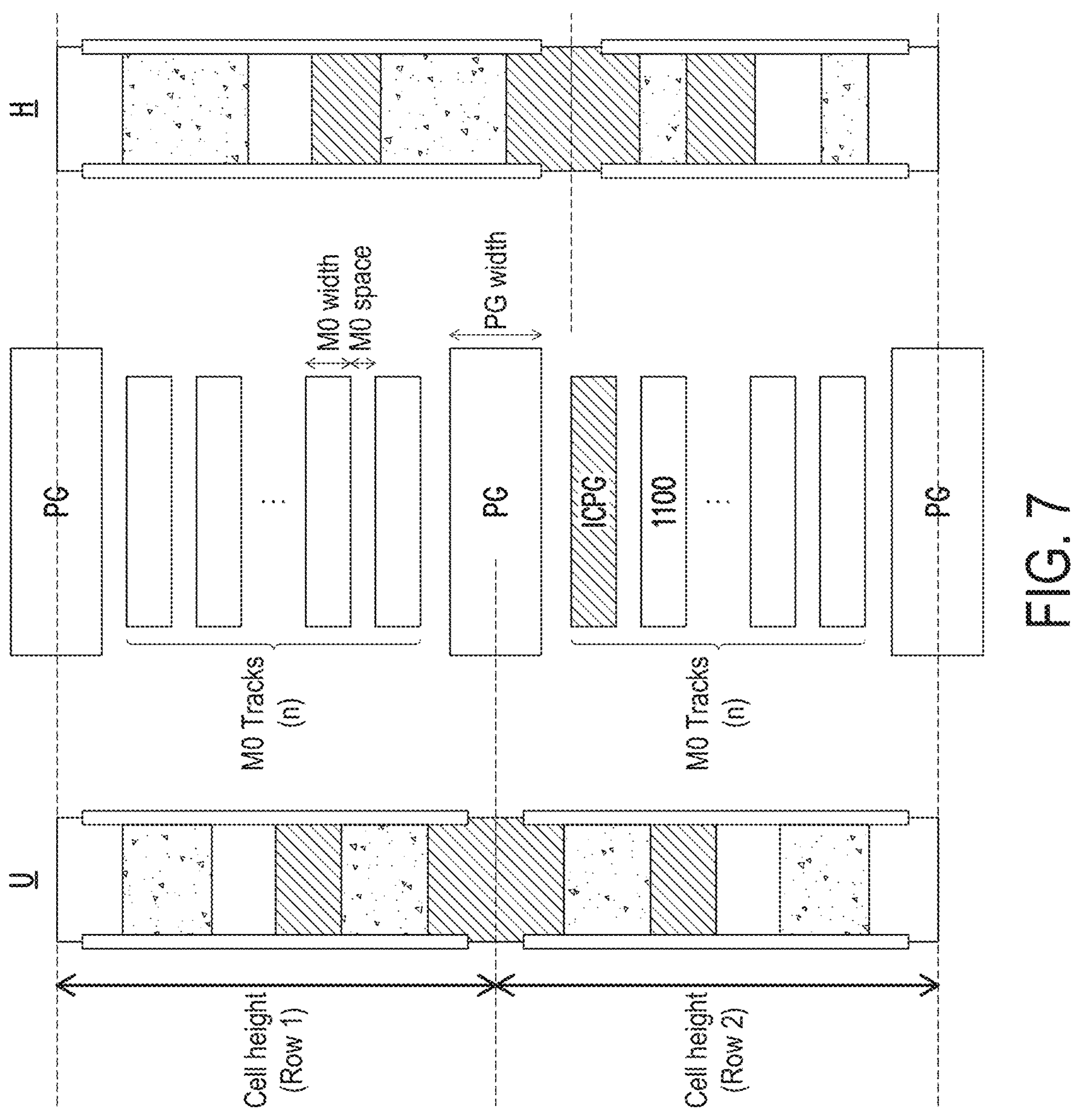
FIG. 7 is an illustration of examples of back end of line (BEOL) structures according to some embodiments.

FIG. 7 is an illustration of examples of back end of line (BEOL) structures according to some embodiments.

FIG. 7 is an illustration of aspects of an M0 layer having PG rails and M0 tracks formed therein.

In FIG. 7, a number of M0 tracks is the same for each row. In some embodiments, a minimum M0 width (determined parallel to the Y axis) is determined by a layout or a design rule of a process. In some embodiments, different M0 tracks may have different widths. In some embodiments, a minimum space (determined parallel to the Y axis) between M0 tracks is determined by a layout or a design rule of a process.

In FIG. 7, a width (determined parallel to the Y axis) of the PG rail is denoted as PG width.

In some embodiments, in the structure shown in FIG. 7, a cell height for the BEOL for Row 1 satisfies the following relationship:

$$\text{cell height} = \text{total } M0 \text{ width} + \text{total } M0 \text{ space} + PG \text{ width}$$

In some embodiments, the above relationship is also true for Row 2.

In some embodiments, all M0 tracks have a same width and all M0 spaces have a same width, and the cell height for the BEOL satisfies the following relationship:

$$\text{cell height} = n * (M0 \text{ width} + M0 \text{ space}) + M0 \text{ space} + PG \text{ width}$$

For the above relationship, 'n' represents the number of M0 tracks.

In some embodiments, the uniform-height cell structure illustrated on the left-hand side of FIG. 7 ('U') corresponds to the cells having the OD width 'a' of the layout 250 of FIG. 5.

In some embodiments, the hybrid-cell structure illustrated on the right-hand side of FIG. 7 ('H') corresponds to the cells having the OD widths 'b3' and 'b4' of the layout 250 of FIG. 5, and for this structure one of the M0 tracks may be designated as an ICPG track.

Figure 8:
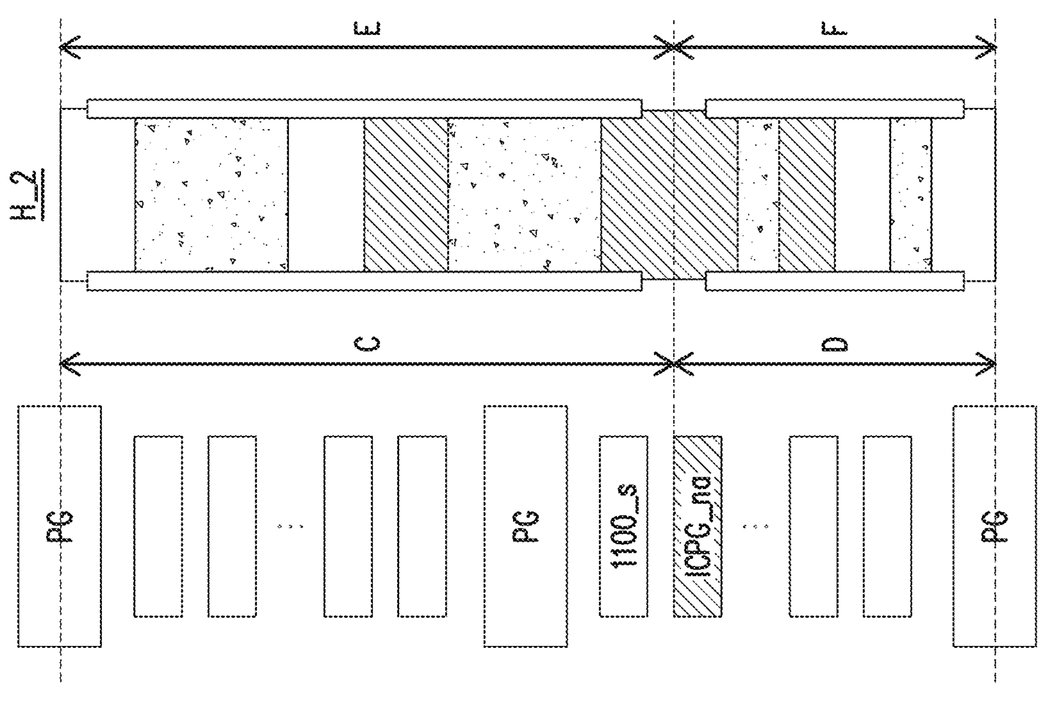
FIG. 8 is an illustration of an example of an adjacent in-cell power/ground (ICPG) track and an example of a nonadjacent ICPG track according to embodiments.
Figure 8:
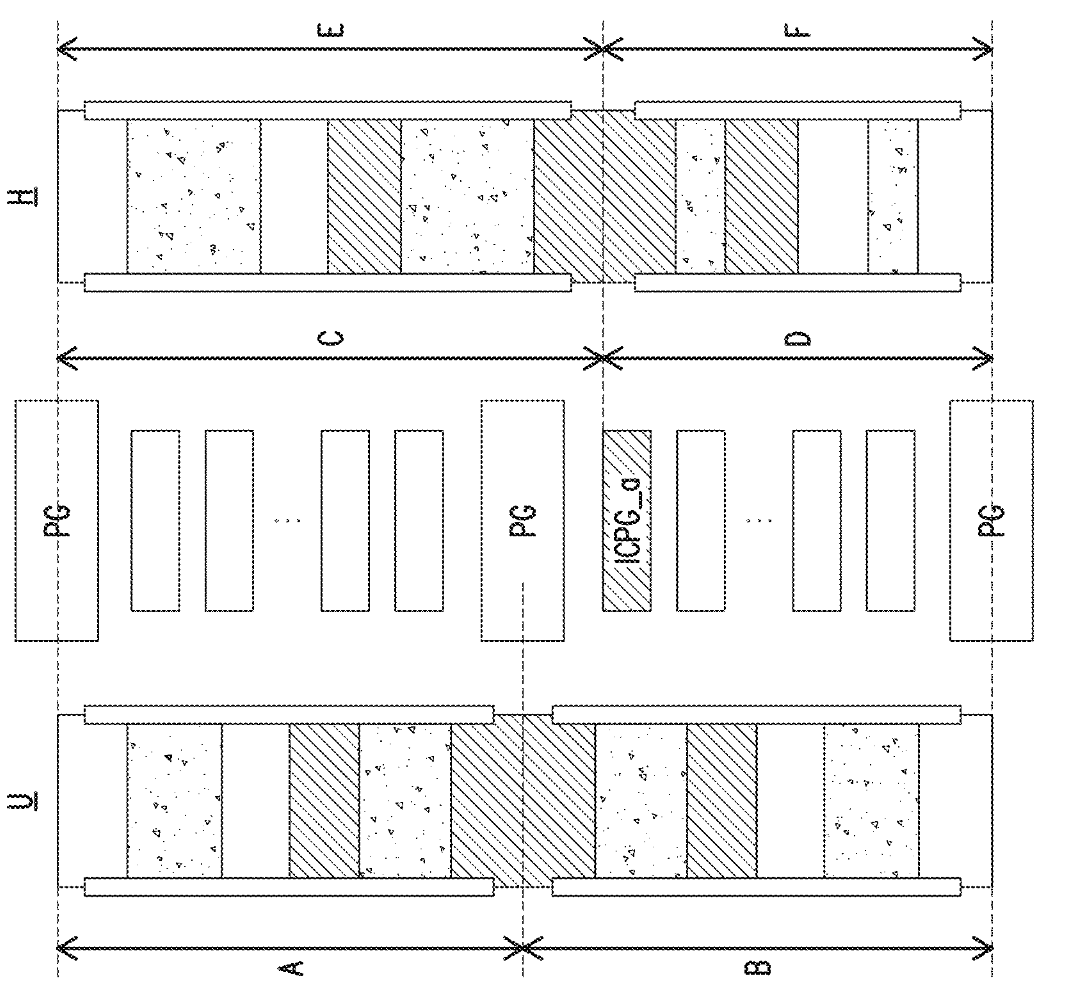

FIG. 8 is an illustration of an example of an adjacent in-cell power/ground (ICPG) track and an example of a nonadjacent ICPG track according to embodiments.

FIG. 8 extends the examples of FIG. 7 by showing the cell structures 'U' and 'H' of FIG. 7, which have an adjacent ICPG (denoted ICPG_a in FIG. 8), alongside a hybrid-cell structure 'H_2' having a non-adjacent ICPG track (denoted ICPG_na in FIG. 8).

In some embodiments, in each of the uniform-cell structure 'U' and the hybrid-cell structures 'H' and 'H_2", the PG rails are separated by identical numbers of tracks. That is, in some embodiments, the total number of tracks 1100 and ICPG tracks between each pair of PG rails is the same.

In FIG. 8, dimensions A, B, C, D, E, and F describe relationships between FEOL and BEOL structures. In some embodiments, these relationships enable a correspondence between cell heights and, e.g., M0 tracks, to thus provide for, among other things, electrical connections of short-height cells to ICPG tracks. In some embodiments, the dimensions A, B, C, D, E, and F satisfy the following relationships:

$$A = n * (M0 \text{ width} + M0 \text{ space}) + M0 \text{ space} + PG \text{ width}$$

$$A = 2 * (OD \text{ width} + OD \text{ space})$$

$$A = B$$

$$C = (n + m) * (M0 \text{ width} + M0 \text{ space}) + 2 * M0 \text{ space} + 1.5 * PG \text{ width}$$

$$D = (n - m) * (M0 \text{ width} + M0 \text{ space}) + 0.5 * PG \text{ width}$$

$$E = 2 * (OD \text{ width\_lg} + OD \text{ space})$$

$$F = 2 * (OD \text{ width\_sm} + OD \text{ space})$$

$$A + B = C + D = E + F$$

$$C \ge E$$

$$D \ge F$$

For the above relationships, the terms 'M0 width', 'M0 space', and 'PG width' are as shown in FIG. 7. Also, 'n' represents the number of M0 tracks 1100, as shown in FIG. 7; 'm' represents the number of sandwiched M0 tracks 1100_*s*, i.e., the number of M0 tracks between non-adjacent ICPG (ICPG_na) and the corresponding PG rail; and 'OD width_lg' represents the larger OD width and 'OD width_sm' represents the smaller OD width in the hybrid-cell structures 'H' and 'H_2'.

Among other things, the relationships C≥E and D≥F are intended to ensure that a short-height cell can connect to an ICPG track.

As described above, in some embodiments the PG rails are part of a power grid that provides power to the device, and one or more of the tracks 1100, which may be in the M0 layer (i.e., which may be an M0 track) are used as, or designated as, an in-cell power/ground (ICPG) track. Various examples of connections between PG rails and ICPG tracks are described below. First, however, a further description of the ICPG track according to an embodiment will be provided.

Figure 9:
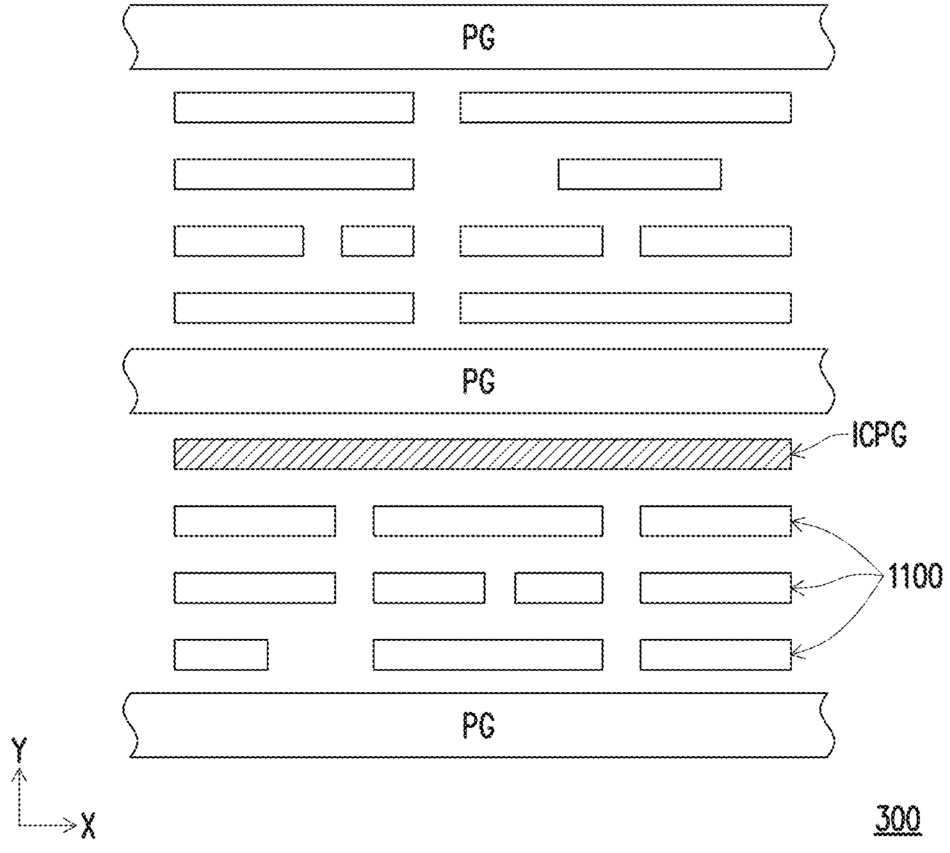
FIG. 9 is an illustration of an example layout having an adjacent ICPG track according to an embodiment.

FIG. 9 is an illustration of an example layout having an adjacent ICPG track according to an embodiment.

In FIG. 9, an example layout 300 includes rows of cells, PG rails, tracks 1100, and ICPG tracks. In some embodiments, the rows extend parallel to the X axis in FIG. 9. In FIG. 9, only a portion of such rows, rails, and tracks are shown. In some embodiments, lateral boundaries of the cells are defined by a CPODE pattern. In some embodiments, the PG rails are aligned with a horizontal boundary, extending parallel to the X axis in FIG. 9, between cells that are above/below each other in the layout 300.

In some embodiments, the PG rails are used to provide power or ground to circuits formed in the cells, the tracks 1100 are used to provide signals to circuits formed in the cells, and the ICPG tracks are used to provide power or ground to circuits formed in the cells. In some embodiments, one or more of the tracks 1100 are designated as, i.e., used as, ICPG tracks.

In some embodiments, a length of the tracks 1100 is different from a length of the ICPG tracks, the lengths being referred to in a row-extending direction of the rows, e.g., horizontally or parallel to the X axis in FIG. 9. In some embodiments, the length of the ICPG tracks is substantially sufficient to span the entire width of the corresponding cell.

In the layout 300 in FIG. 9 a single cell width is illustrated by way of example.

In some embodiments, the PG rails extend beyond the cell width. In some embodiments the PG rails extend for an entire length of a row having several or many cells. In some embodiments, the PG rails have a dimension, as determined parallel to the X axis, that is at least as great as a combined dimension, as determined in parallel to the X axis, of two laterally adjacent cells. In some embodiments, the PG rails have a dimension, as determined parallel to the X axis, that is at least as great as a combined dimension, as determined in parallel to the X axis, of three or more laterally adjacent cells.

In some embodiments, lengths of the tracks 1100 within the cell vary according to, e.g., the types of internal connections of circuits in the cell, whereas the length of the ICPG track is substantially sufficient to span the entire width of the cell. In some embodiments, the tracks 1100 and the ICPG tracks do not extend into a laterally adjacent cell. In some embodiments, the tracks 1100 are shorter than the ICPG track, as determined horizontally or parallel to the X axis. In some embodiments, the ICPG track has a dimension, as determined parallel to the X axis, that is equal to a dimension of the corresponding cell as determined parallel to the X axis. In some embodiments, the ICPG track has a dimension, as determined parallel to the X axis, that is less than a dimension of the corresponding cell as determined parallel to the X axis but greater than a longest non-ICPG track 1100 in said cell, as determined parallel to the X-axis.

In some embodiments, the PG rails, the tracks 1100, and the ICPG tracks are formed in a same layer. For example, in some embodiments the PG rails, the tracks 1100, and the ICPG tracks are all formed in the M0 layer.

In some embodiments, the ICPG track formed as an M0 power rail is not disconnected, such that a hybrid-row region has a long M0 track (ICPG) on the small OD side.

Figure 10A:
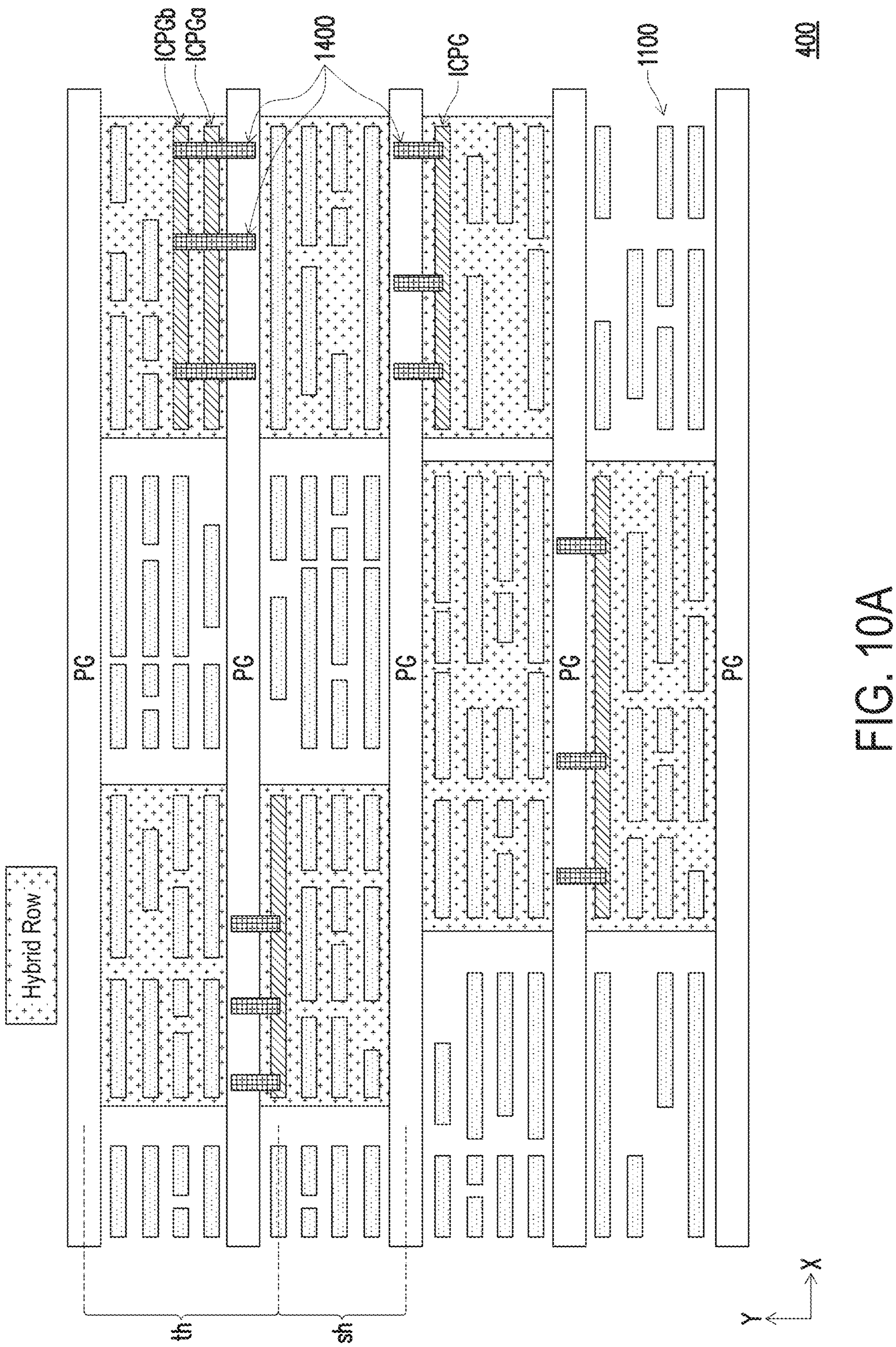
FIGS. 10A and 10B are illustrations of a first example connection structure for an ICPG track according to an embodiment.
Figure 10B:
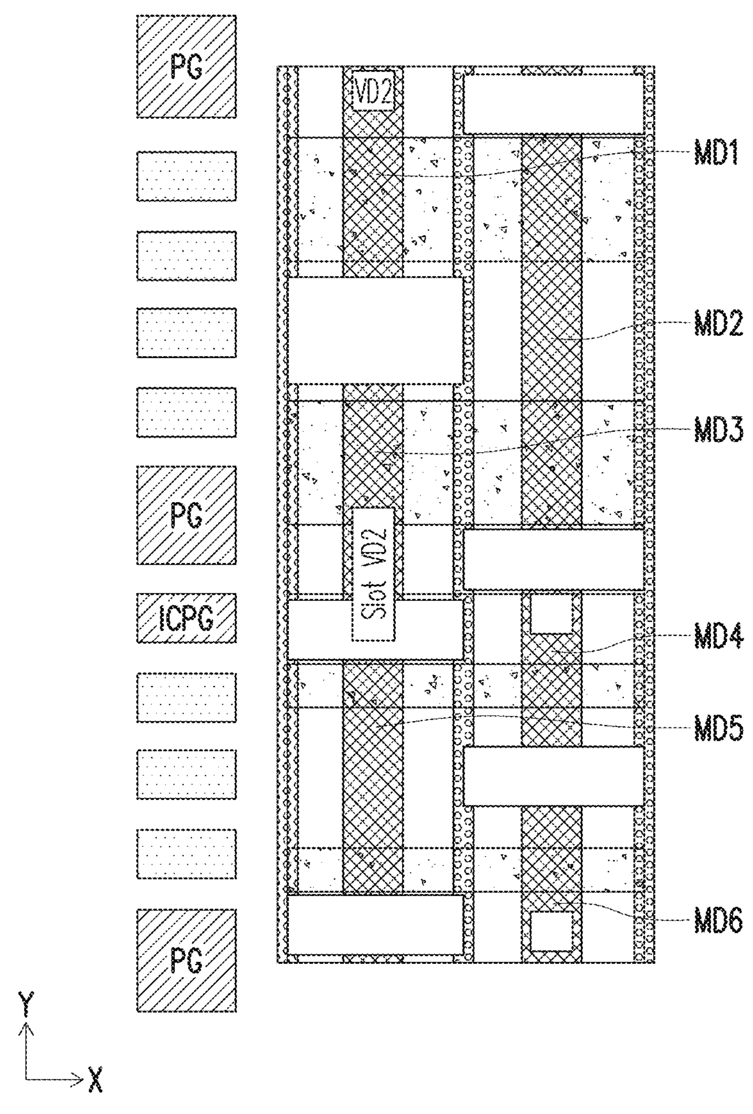

FIGS. 10A and 10B are illustrations of a first example connection structure for an ICPG track according to an embodiment.

FIG. 10A is an illustration of a layout 400 that encompasses the above-described aspects of the layout 300. The layout 400 includes a first implementation of a connection of the ICPG track to the PG rail. In FIG. 10A, shaded cells indicate a hybrid row.

In the layout 400, the ICPG track corresponds to a boundary, which extends parallel to the X axis direction, between two cells that are vertically adjacent to one another. For example, the layout 400 includes an adjacent ICPG track that corresponds to a boundary in the X axis direction between a tall-height cell (th) and a short-height cell (sh) that are vertically adjacent to one another. The tall-height cell (th) and the short-height cell (sh) are hybrid row cells. In some embodiments, the ICPG track is configured to maintain a supply voltage that is provided to a source of a first transistor in the tall-height cell (th) and provided to a source of a second transistor in the short-height cell (sh).

In the layout 400, the PG rails extend beyond the cell width. In some embodiments the PG rails extend for an entire length of a row having several or many cells. In some embodiments, lengths of the tracks 1100 within the cell vary according to, e.g., the types of internal connections of circuits in the cell, whereas the length of the ICPG track is substantially sufficient to span the entire width of the cell. In some embodiments, the tracks 1100 in the tall-height and short-height cells (th, sh) and the ICPG track at the boundary thereof do not extend into a laterally adjacent cell. In some embodiments, the tracks 1100 in the tall-height and short-height cells (th, sh) are shorter than the ICPG track at the boundary thereof, as determined horizontally or parallel to the X axis. In some embodiments, the ICPG track at the boundary of the tall-height and short-height cells (th, sh) has a dimension, as determined parallel to the X axis, that is equal to a dimension of the tall-height and short-height cells (th, sh) as determined parallel to the X axis. In some embodiments, the ICPG track at the boundary of the tall-height and short-height cells (th, sh) has a dimension, as determined parallel to the X axis, that is less than a dimension of the tall-height and short-height cells (th, sh) as determined parallel to the X axis but greater than a longest non-ICPG track 1100 in either of the tall-height and short-height cells (th, sh), as determined parallel to the X-axis.

In FIG. 10A, an electrical connection is formed between the ICPG track and the PG rail using a connection 1400. In FIG. 10A, a plurality of the connections 1400 are illustrated. In some embodiments, one or more than one of the connection 1400 is provided for each ICPG track.

By way of example, the layout 400 also shows one cell that has two ICPG tracks, denoted ICPGa and ICPGb for clarity, and two tracks 1100. In some embodiments, connection of the ICPG track ICPGb by way of the connection 1400 also results in connection of the sandwiched ICPG track ICPGa. That is, in some embodiments the connection 1400 connects both of the ICPG tracks ICPGa and ICPGb to the PG rail.

FIG. 10B is an illustration of an example of the connection 1400 according to an embodiment.

In some embodiments, the connection 1400 is an extended or slot-like version of a connection that connects a metalization layer (e.g., a metal over diffusion (MD) layer) to the PG rail, the extension also connecting a track 1100 (i.e., the ICPG) to the PG rail. In some embodiments, the extension has a longitudinal dimension that extends parallel to the Y axis direction. In some embodiments, the connection 1400 is a slot-like extension of a via over diffusion (VD) layer connection (e.g., a VD2 connection) between the MD layer and the PG rail. In some embodiments, the VD2 layer is a layer between the OD (active region) and the M0 layer. In some embodiments, the VD2 layer includes connections that connect the OD to the PG rail.

In some embodiments, the MD layer has conductive elements that extend parallel to the Y axis direction. In FIG. 10B, the MD layer is shown with conductive elements MD1, MD2, MD3, MD4, MD5, and MD6. In some embodiments, the connection 1400 is a slot VD2 connection that is extended along a conductive element in the MD layer to connect the PG rail in M0 with the ICPG track in M0. By way of example, FIG. 10B illustrates a slot VD2 connection disposed along MD3 and connecting the ICPG track in M0 to the PG rail in M0.

In FIGS. 10A and 10B, tall cells accompany short cells, and the tall cells and the short cells are aligned vertically. In some embodiments, a VD2 connection is used to connect MD and the PG rail (M0_PG), and is extended as a slot VD2 over MD to facilitate connection to the ICPG track (in-cell M0_PG connection).

Further to the above, in some embodiments connection of the ICPG track ICPGb by way of a slot VD2 connection also results in connection of the sandwiched ICPG track ICPGa. Thus, the use of the slot VD2 connection to connect a non-adjacent PG rail such as ICPGb may be reserved for cases in which an overall M0 routing resource is sufficient for large cell use.

Figure 10C:
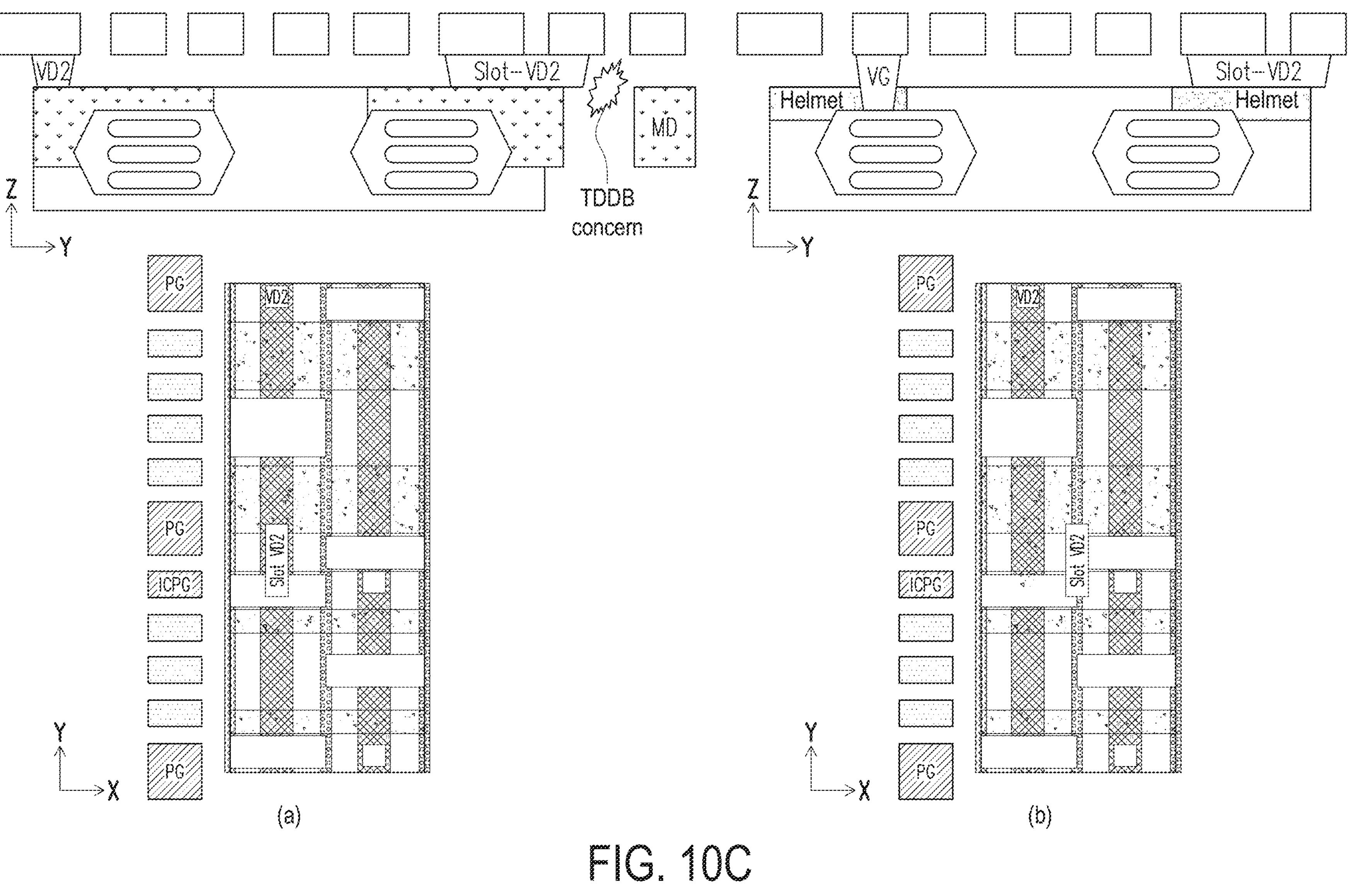
FIGS. 10C and 10D are illustration of aspects of a slot VD2 connection according to an embodiment.
Figure 10D:
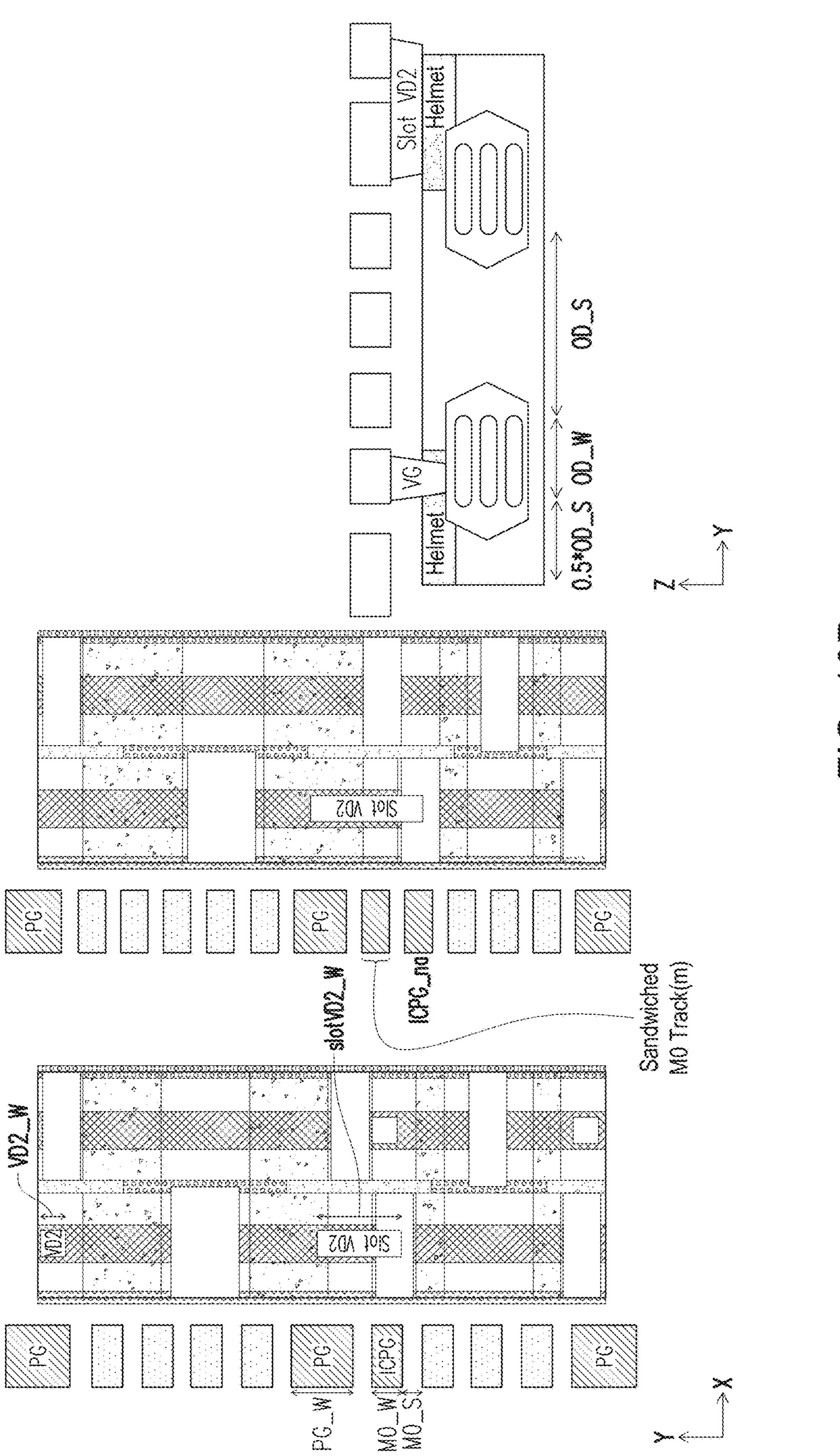

FIGS. 10C and 10D are illustrations of aspects of a slot VD2 connection according to an embodiment.

In FIG. 10C, a slot VD2 connection is used to connect an adjacent ICPG track to a PG rail in M0. In FIG. 10C, in (a) the slot VD2 connection is located over MD, and in (b) the slot VD2 connection is located over the poly.

Referring to (a), the MD covers the epi layer to provide lower resistance. The MD is connected to the epi, and the VD2 is connected to the PG rail.

In the structure shown in (a), when implementing a slot VD2, the slot VD2 may get too close to another cell's MD, in which case there may be a time-dependent dielectric breakdown (TDDB) concern. For example, for a case in which the VD2 is a power signal and the opposite MD is another cell's internal signal, there may be a voltage difference that may lead to leakage or dielectric breakdown.

To help avoid such leakage or dielectric breakdown, referring to (b) in FIG. 10C, the VD2 may be changed to be on the poly or gate region. By moving the slot VD2 connection to the poly, the TDDB concern may be reduced or eliminated.

In the case that the slot VD2 is on the poly, the power signal should be isolated from the poly signal. Thus, in FIG. 10C, the structure shown in (b) includes a helmet that isolates the poly. In some embodiments, the helmet is used on the poly regardless of whether the slot VD2 is used or not. In some embodiments, the helmet is a nitride. In (b), VG connects to the signal track (e.g., as a via connection to the gate).

Referring to FIG. 10D, in some embodiments the slot VD2 connection is formed to satisfy the following relationships:

a ratio M0_W/M0_S is in a range of about 0.8 to about 1.2 a ratio PG_W/M0_W is in a range of about 1 to about 1.25

$$\text{slotVD2\_W} > 0.5 * \text{PG\_W} + m * (\text{M0\_S} + \text{M0\_W}) + \text{M0\_S} + 0.5 * \text{M0\_W}$$

a ratio slotVD2_W/VD2_W is in a range of about 2 to about 5

$$\text{Helmet\_W} > 0.5 * (\text{OD\_S} + \text{OD\_W})$$

For the above relationships, M0_W is the width of M0 as determined parallel to the Y axis; M0_S is the width of the M0 space (space between adjacent M0 tracks) as determined parallel to the Y axis; PG_W is the width of the PG rail as determined parallel to the Y axis; slotVD2_W is the width of the slot VD2 connection as determined parallel to the Y axis; VD2_W is the width of a VD2 connection as determined parallel to the Y axis; Helmet_W is the width of the helmet as determined parallel to the Y axis; OD_S is the width of the space between adjacent active regions (OD regions) as determined parallel to the Y axis; OD_W is the width of the active region (OD region) as determined parallel to the Y axis; and 'm' represents the number of sandwiched M0 tracks 1100_*s*, i.e., the number of M0 tracks between the non-adjacent ICPG (ICPG_na) and the corresponding PG rail.

Figure 11A:
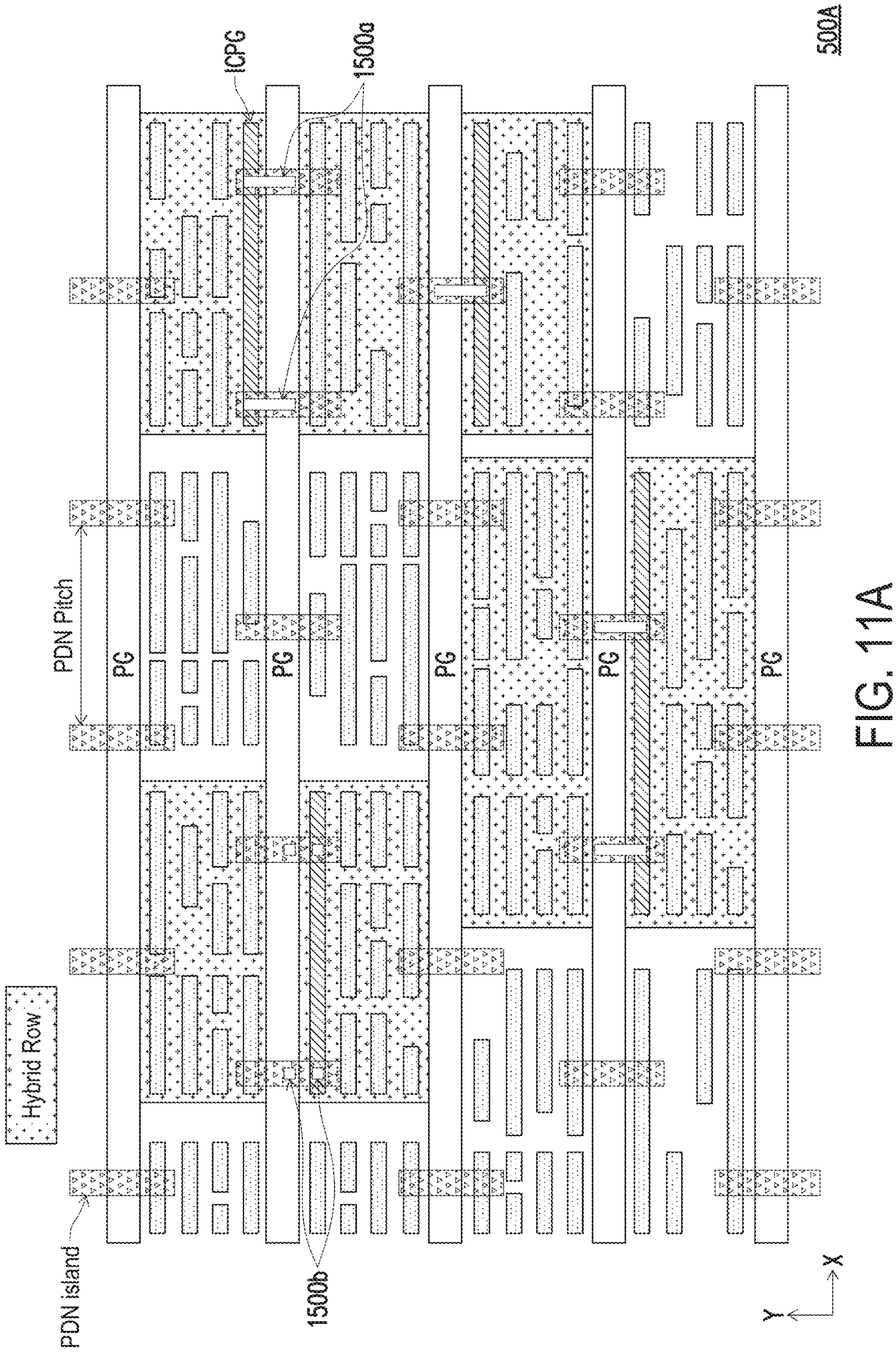
FIGS. 11A and 11B are illustrations of a second example connection structure according to an embodiment.
Figure 11B:
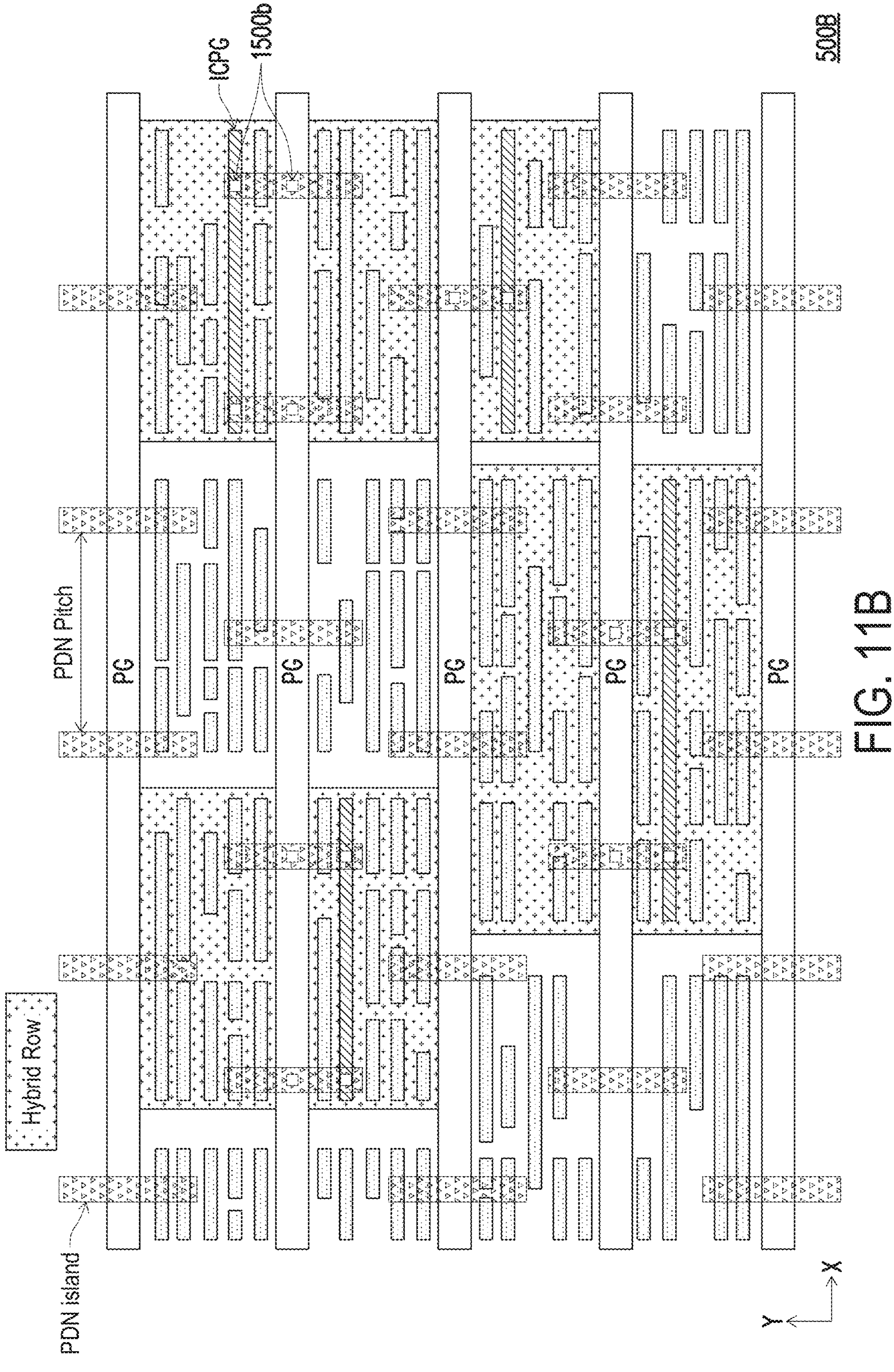

FIGS. 11A and 11B are illustrations of a second example connection structure according to an embodiment.

FIG. 11A is an illustration of a layout 500A according to an embodiment. The layout 500A includes a second implementation of a connection of the ICPG track to the PG rail.

In FIG. 11A, an electrical connection is formed between the ICPG track and the PG rail using a slot connection 1500*a*. In FIG. 11A, a plurality of the slot connections 1500*a* are provided. In some embodiments, one slot connection 1500*a* or more than one slot connection 1500*a* is provided for each ICPG track.

In some embodiments, the slot connection 1500*a* is an extension of a VIA0 connection between the ICPG track in M0 and the PG rail in M0, i.e., the VIA0 connection is extended as a slot. In some embodiments, the VIA0 layer is between the M0 layer and an M1 layer, which is disposed over the M0 layer. In some embodiments, conductive elements in the M1 layer extend in a direction that is generally orthogonal to an extending direction of conductive elements in the M0 layer.

In some embodiments, the slot connection 1500*a* is aligned with a power delivery network (PDN) island. In some embodiments, the PDN island is in the M1 layer. In some embodiments, a plurality of PDN islands is provided. In some embodiments, the PDN islands are spaced apart by a pitch, denoted in FIG. 11A as a PDN pitch. In some embodiments, the PDN pitch is uniform in the layout, such that the PDN islands appear at regular intervals.

In some embodiments, the slot connection 1500*a* has a longitudinal direction that is parallel to the Y axis direction and parallel to an extending direction of the PDN island.

Although the layout 500A is shown as including the slot connections 1500*a*, in other embodiments discreet connections 1500*b* are implemented, as also shown in the layout 500A.

FIG. 11B is an illustration of a layout 500B according to an embodiment. The layout 500B includes another example of the second implementation of a connection of the ICPG track to the PG rail.

In FIG. 11B, a plurality of the discreet connections 1500*b* is implemented to connect a non-adjacent ICPG track to the PG rail, such that a sandwiched track (i.e., a track 1100) is not connected to the PG rail.

Figure 11C:
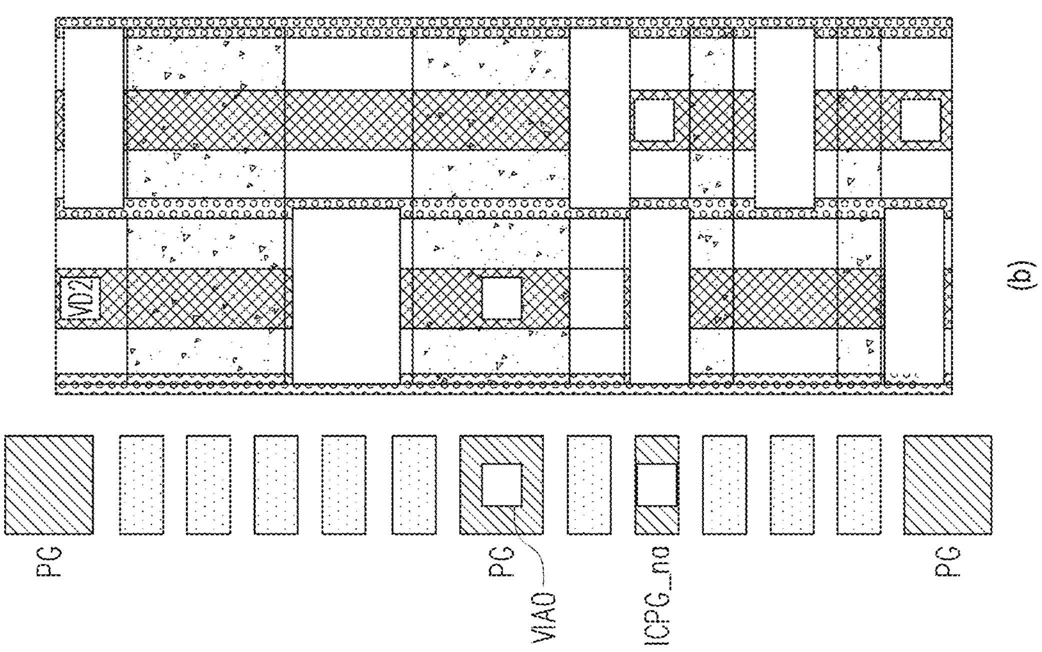
FIGS. 11C and 11D are illustrations of aspects of a slot VIA0 connection according to an embodiment.
Figure 11C:
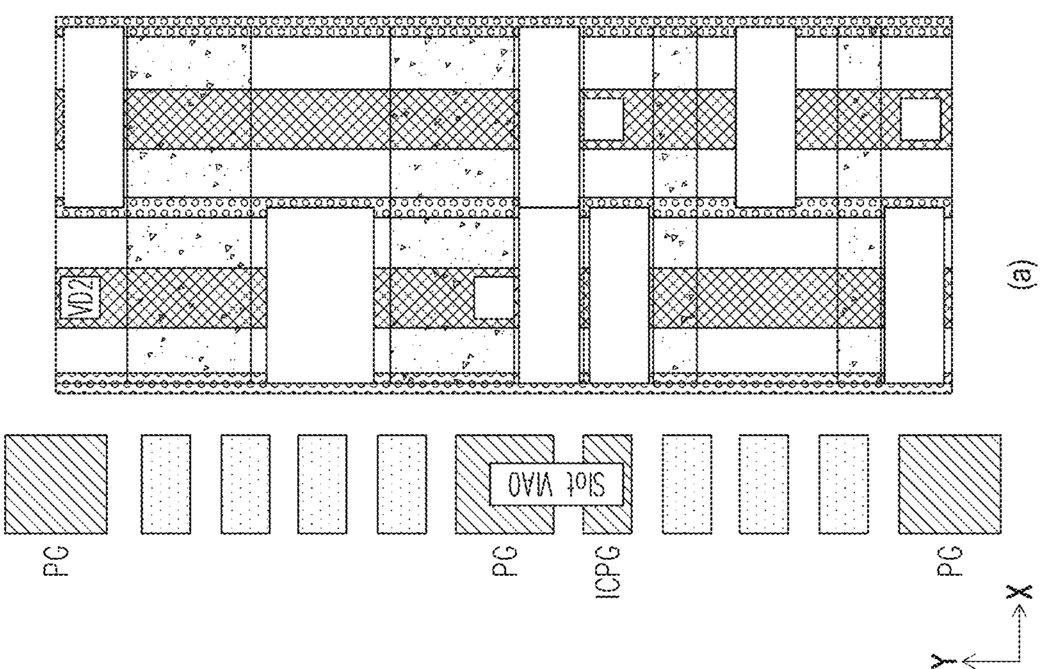
Figure 11D:
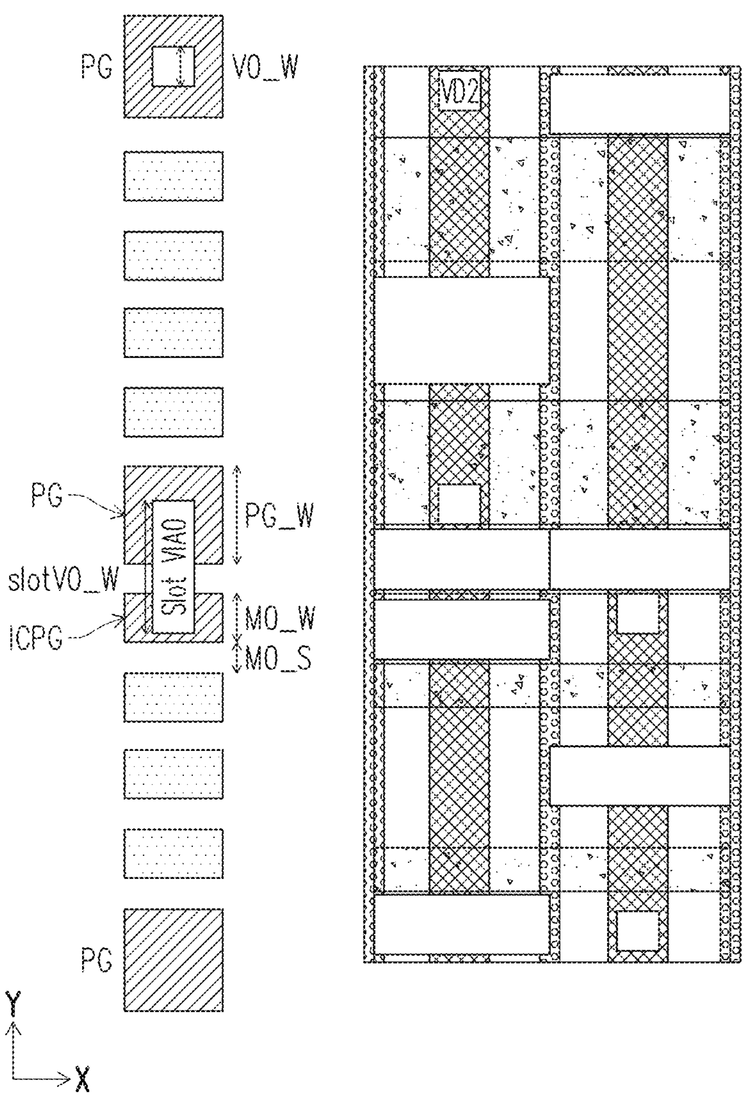

FIGS. 11C and 11D are illustrations of aspects of a slot VIA0 connection according to an embodiment.

In FIG. 11C. (a) includes a slot VIA0 connection and (b) includes a discrete VD2 connection.

With reference to FIGS. 11A-11C, in some embodiments a connection in a VIA0 layer is used to connect M0_PG with M1_PG (i.e., an M1 layer PG conductive element), and a slot VIA0 is extended to facilitate an ICPG connection.

In some embodiments, the VIA0 connections are formed to correspond to the M1 layer. To avoid conflicts with cell pins, in some embodiments the VIA0 connection is located only in places where there is PDN (power delivery network) island. In some embodiments, the PDN islands are located at a fixed interval (pitch), and corresponding VIA0 connections are placed accordingly.

Also, with reference to structure (b) in FIG. 11C, in some embodiments the VIA0 connection for pickup usage is also used for connection of the PG rail with a nonadjacent ICPG track.

Referring to FIG. 11D, in some embodiments the slot VIA0 connection is formed to satisfy the following relationships:

a ratio M0_W/M0_S is in a range of about 0.8 to about 1.2 a ratio PG_W/M0_W is in a range of about 1 to about 2.5

$$\text{slotV0\_W} > 0.5 * \text{PG\_W} + \text{M0\_S} + 0.5 * \text{M0\_W}$$

a ratio slotV0_W/V0_W is in a range of about 2 to about 5

For the above relationships, M0_W is the width of M0 as determined parallel to the Y axis; M0_S is the width of the M0 space (space between adjacent M0 tracks) as determined parallel to the Y axis; PG_W is the width of the PG rail as determined parallel to the Y axis; slotV0_W is the width of the slot VIA0 connection as determined parallel to the Y axis; and V0_W is the width of a VIA0 connection as determined parallel to the Y axis.

Figure 12A:
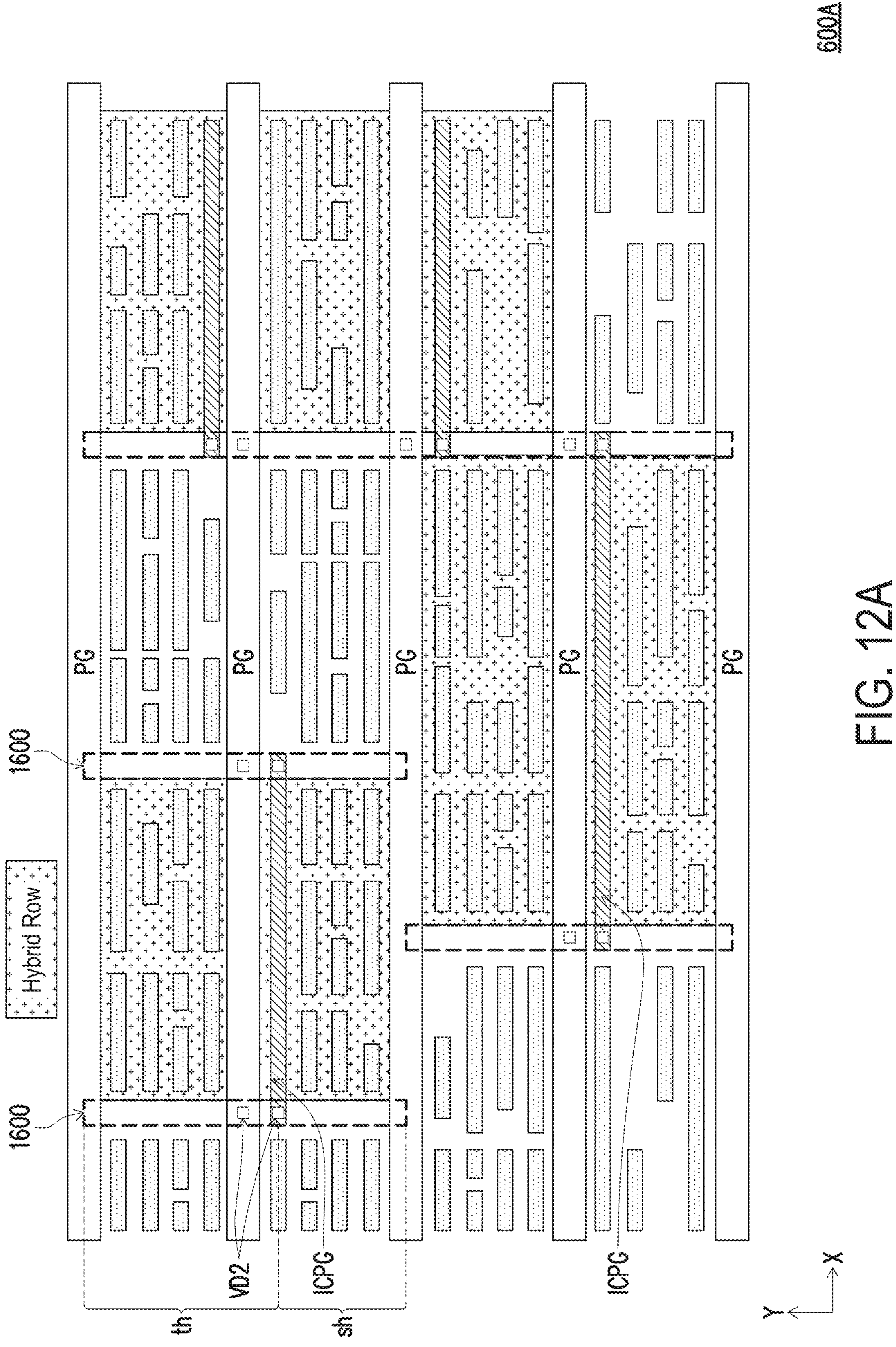
FIGS. 12A and 12B are illustrations of a third example connection structure according to an embodiment.
Figure 12B:
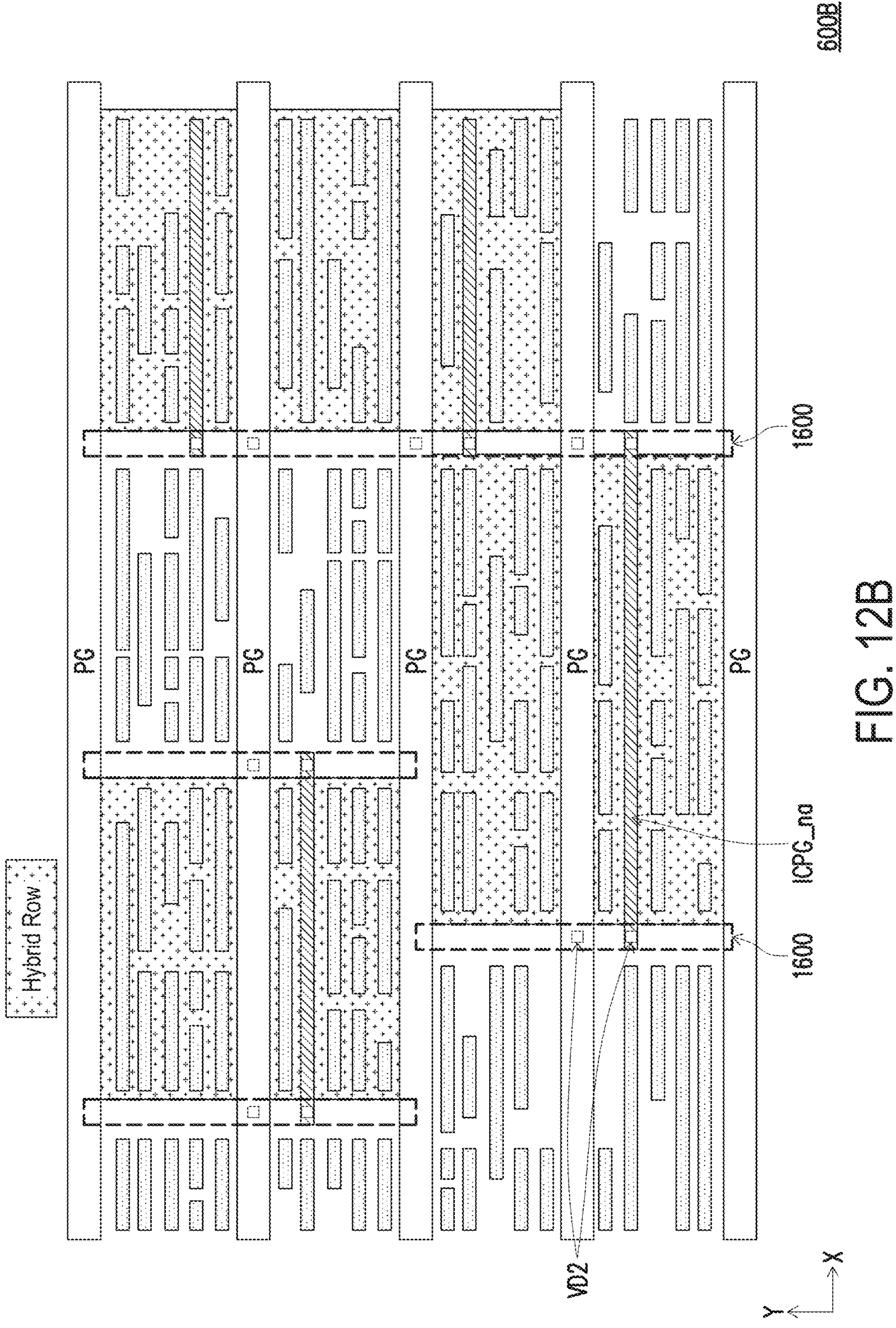

FIGS. 12A and 12B are illustrations of a third example connection structure according to an embodiment.

FIG. 12A is an illustration of a layout 600A according to an embodiment. The layout 600A includes a third implementation of a connection of the ICPG track to the PG rail.

In FIG. 12A, a layout 600A has a padding cell 1600, indicated by a dashed line. In some embodiments, the padding cell 1600 is located at a junction, in a row direction, of cells having different heights. For example, with reference to FIGS. 1 and 12A, in some embodiments the padding cell 1600 is located in a first row at a junction between the medium cell 1010 (see upper medium cell 1010 in FIG. 1) and the large cell 1030, and is located in a second row at a junction between the medium cell 1010 (see lower medium cell 1010 in FIG. 1) and the small cell 1020. In some embodiments, one of the padding cells 1600 is provided at each junction of a uniform-height cell with a hybrid-height cell.

The padding cell 1600 may have a double cell height. For example, in some embodiments a dimension of the padding cell (as determined parallel to the Y axis) is twice the height of the medium cell 1010.

In some embodiments, the padding cell 1600 has a width (as determined parallel to the X axis) that is determined by a device fabrication process or process node.

In FIG. 12A, the ICPG track is connected to the PG rail using VD2 connections in the padding cell 1600. In some embodiments, the ICPG track is connected at opposite ends thereof to the PG rail.

In some embodiments, the VD2 connections for the tall-height cell (th) and the short-height cell (sh) (hybrid row cells) are in padding cells 1600 that are laterally adjacent to the tall-height cell (th) and the short-height cell (sh).

In some embodiments, the layout 600A is used with a cell grouping approach in which tall cells and short cells are placed in adjacent rows with an x-padding constraint or a padding cell having a width as determined parallel to the X axis.

FIG. 12B is an illustration of a layout 600B according to an embodiment. The layout 600B includes another example of the third implementation of a connection of the ICPG track to the PG rail.

In FIG. 12B, the padding cell 1600 is used to form connections that connect a non-adjacent or sandwiched ICPG track (ICPG_na) to the PG rail.

In some embodiments, the layout 600B is used with the cell grouping approach.

Figure 12C:
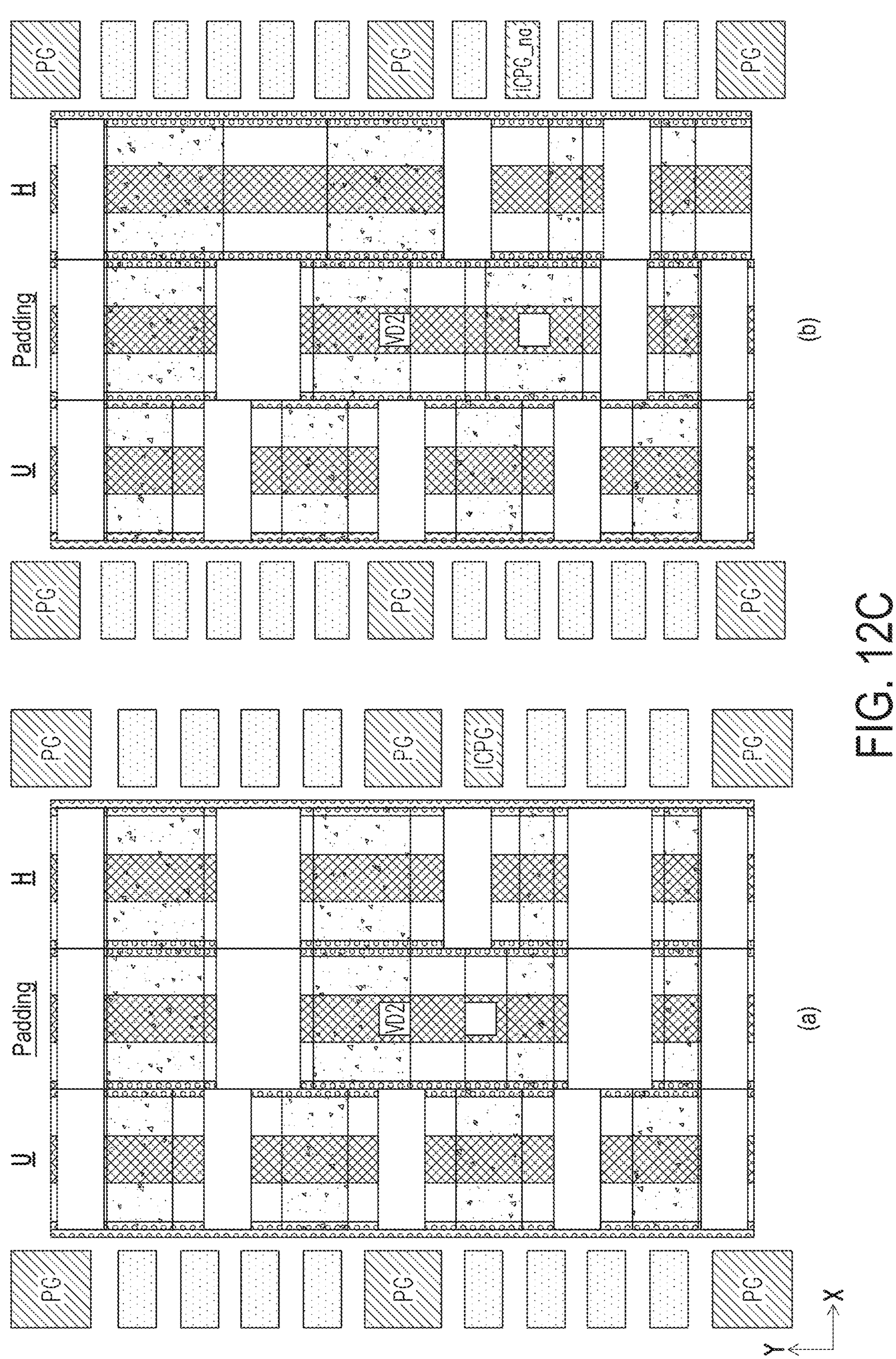
FIG. 12C is an illustration of aspects of a padding cell connection according to an embodiment.

FIG. 12C is an illustration of aspects of a padding cell connection according to an embodiment.

In structures (a) and (b) in FIG. 12C, a padding cell ('Padding') is provided at each junction of a uniform-height cell ('U') with a hybrid-height cell ('H'). In some embodiments, the padding cell is used to connect M0_PG with an in-cell M0_PG (i.e., with an ICPG track) using VD2 connections. In structure (b) in FIG. 12C, a padding cell designed for pickup usage is used to connect the PG rail with a nonadjacent ICPG track (i.e., with ICPG_na).

Figure 13A:
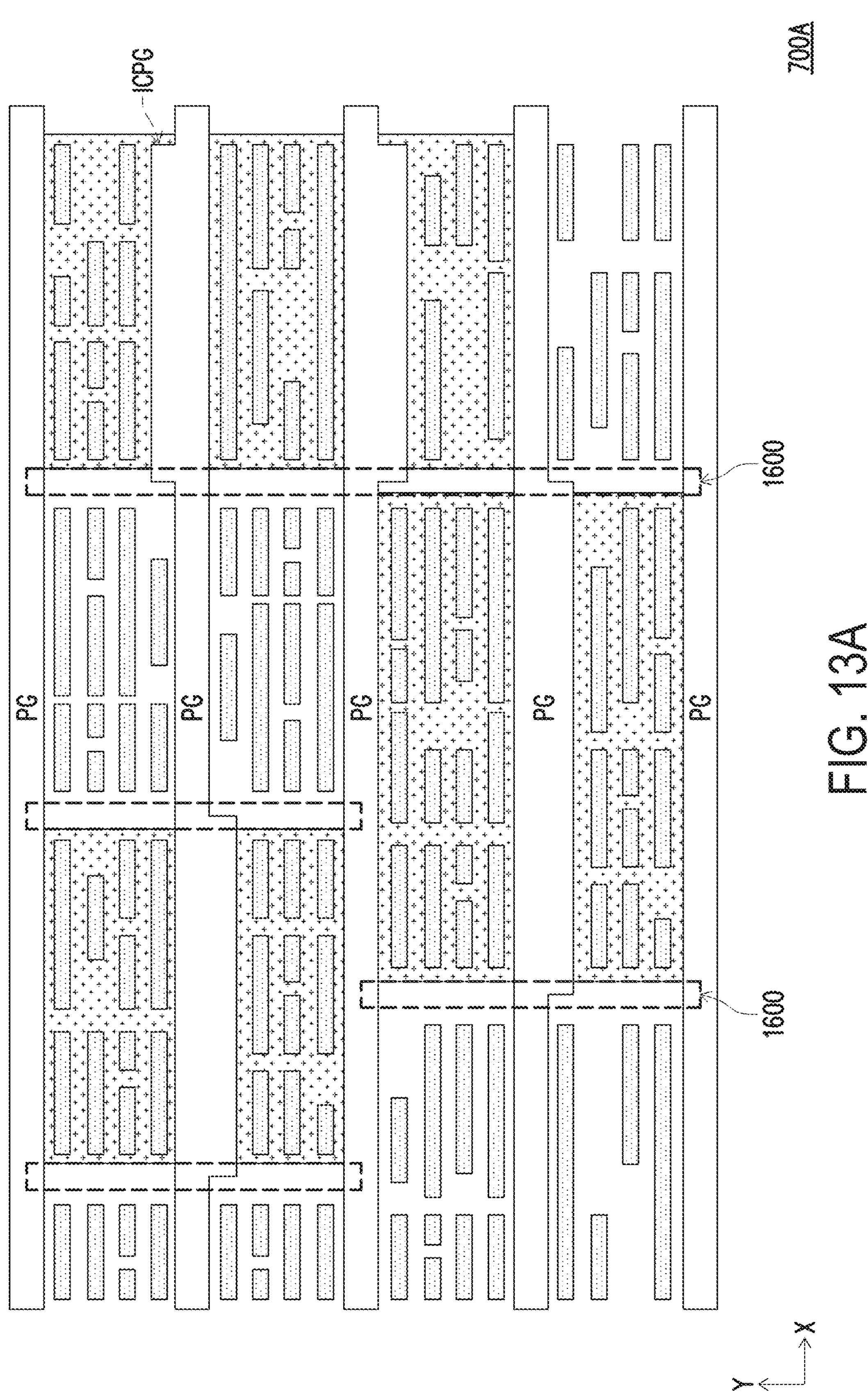
FIGS. 13A and 13B are illustrations of a fourth example connection structure according to an embodiment.
Figure 13B:
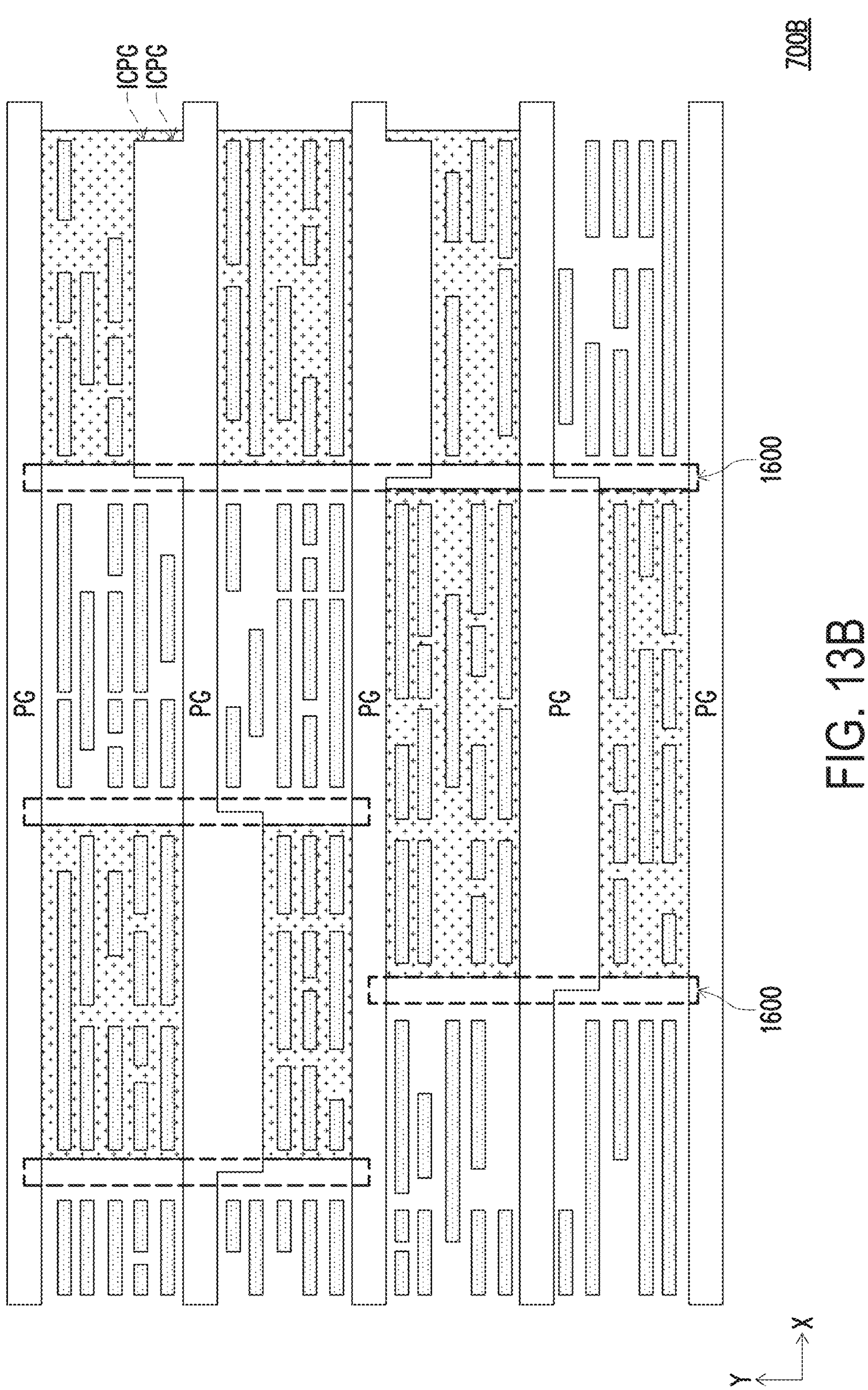

FIGS. 13A and 13B are illustrations of a fourth example connection structure according to an embodiment.

FIG. 13A is an illustration of a layout 700A according to an embodiment. The layout 700A includes a fourth implementation of a connection of the ICPG track to the PG rail.

In FIG. 13A, a layout 700A has the padding cell 1600. In some embodiments, the padding cell 1600 has a double cell height. For example, in some embodiments a dimension of the padding cell (as determined parallel to the Y axis) is twice the height of the medium cell 1010. In some embodiments, the padding cell 1600 has a width, as determined parallel to the X axis, that is determined by a device fabrication process or process node.

As discussed above in connection with FIGS. 12A-12B, in some embodiments the padding cell 1600 is located at a junction in a row direction of cells having different heights. In some embodiments, a padding cell is provided at each junction of a uniform-height cell with a hybrid-height cell.

In some embodiments, the padding cell is used to connect M0_PG with an in-cell M0_PG (i.e., with an ICPG track). Referring to FIG. 13A, in some embodiments the ICPG track and the PG rail are formed as an integral conductive element, e.g., in the M0 layer. In other words, in some embodiments the ICPG track and the PG rail are stitched together in the M0 layer. In some embodiments, the ICPG track and the PG rail are stitched together along an entire length of the ICPG track, as indicated by the dashed arrow in FIG. 13A.

In some embodiments, a change in height (as determined parallel to the Y axis) of the integral ICPG track-PG rail is made at the padding cell 1600. In some embodiments, the padding cell 1600 is located at a junction of cells having different heights, and the change in height of the integral ICPG track-PG rail occurs in the padding cell 1600. In some embodiments, the change in height (as determined parallel to the Y axis) of the integral ICPG track-PG rail is made in padding cells 1600 that are laterally adjacent to the tall-height cell (th) and the short-height cell (sh).

In some embodiments, the layout 700A is used with the cell grouping approach.

FIG. 13B is an illustration of a layout 700B according to an embodiment. The layout 700B includes another example of the fourth implementation of a connection of the ICPG track to the PG rail.

FIG. 13B is an illustration of a layout 700B having the padding cell 1600. As in FIGS. 12A-12B, in some embodiments the padding cell 1600 is located at a junction in a row direction of cells having different heights.

In FIG. 13B, a non-adjacent ICPG track and the PG rail are formed as an integral conductive element, e.g., in the M0 layer. In some embodiments, this also connects what would otherwise be the sandwiched track 1100, as indicated by two dashed arrows in FIG. 13B. Thus, in some embodiments two ICPG tracks and the PG rail may be stitched together as an integral conductive element in the M0 layer.

Also, as discussed above in connection with FIG. 13A, in some embodiments the change in height of the integral two-ICPG tracks-PG rail is made at the padding cell 1600. In some embodiments, the padding cell 1600 is located at a junction of cells having different heights, and the change in height of the integral two-ICPG tracks-PG rail occurs in the padding cell 1600.

In some embodiments, the layout 700B is used with the cell grouping approach.

Figure 13C:
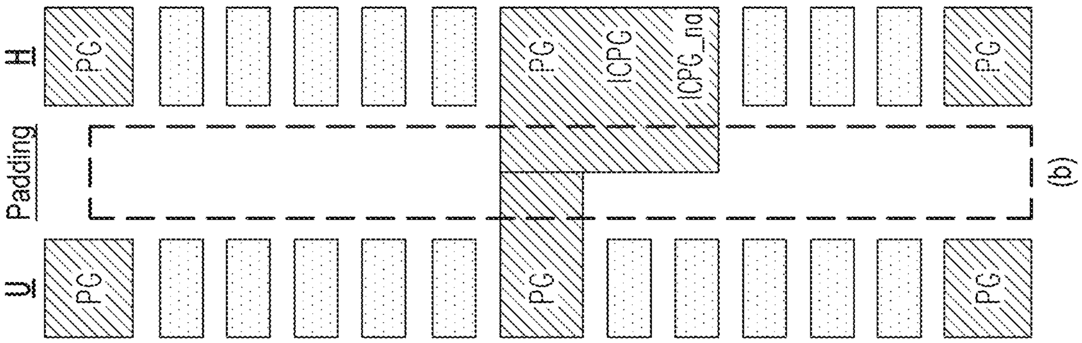
FIGS. 13C and 13D are illustrations of aspects of a padding cell connection with an integral structure according to an embodiment.
Figure 13C:
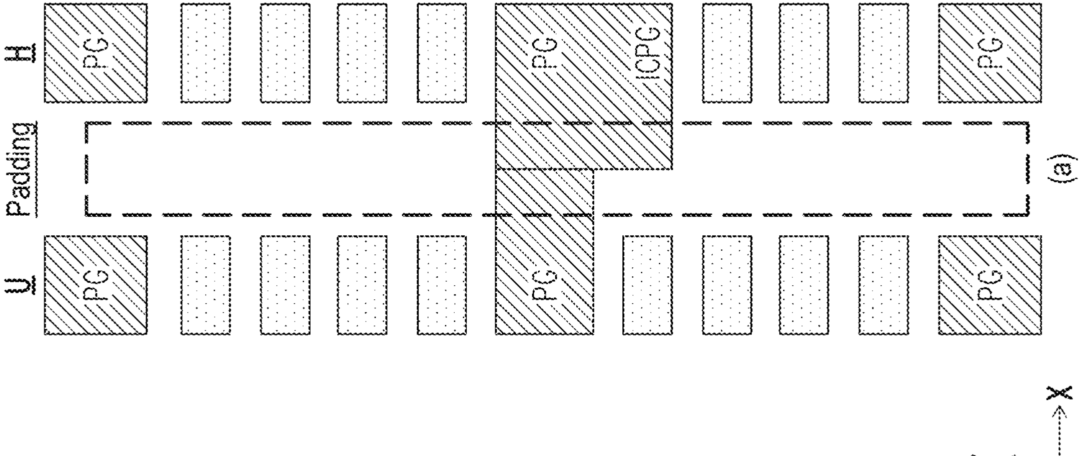
Figure 13D:
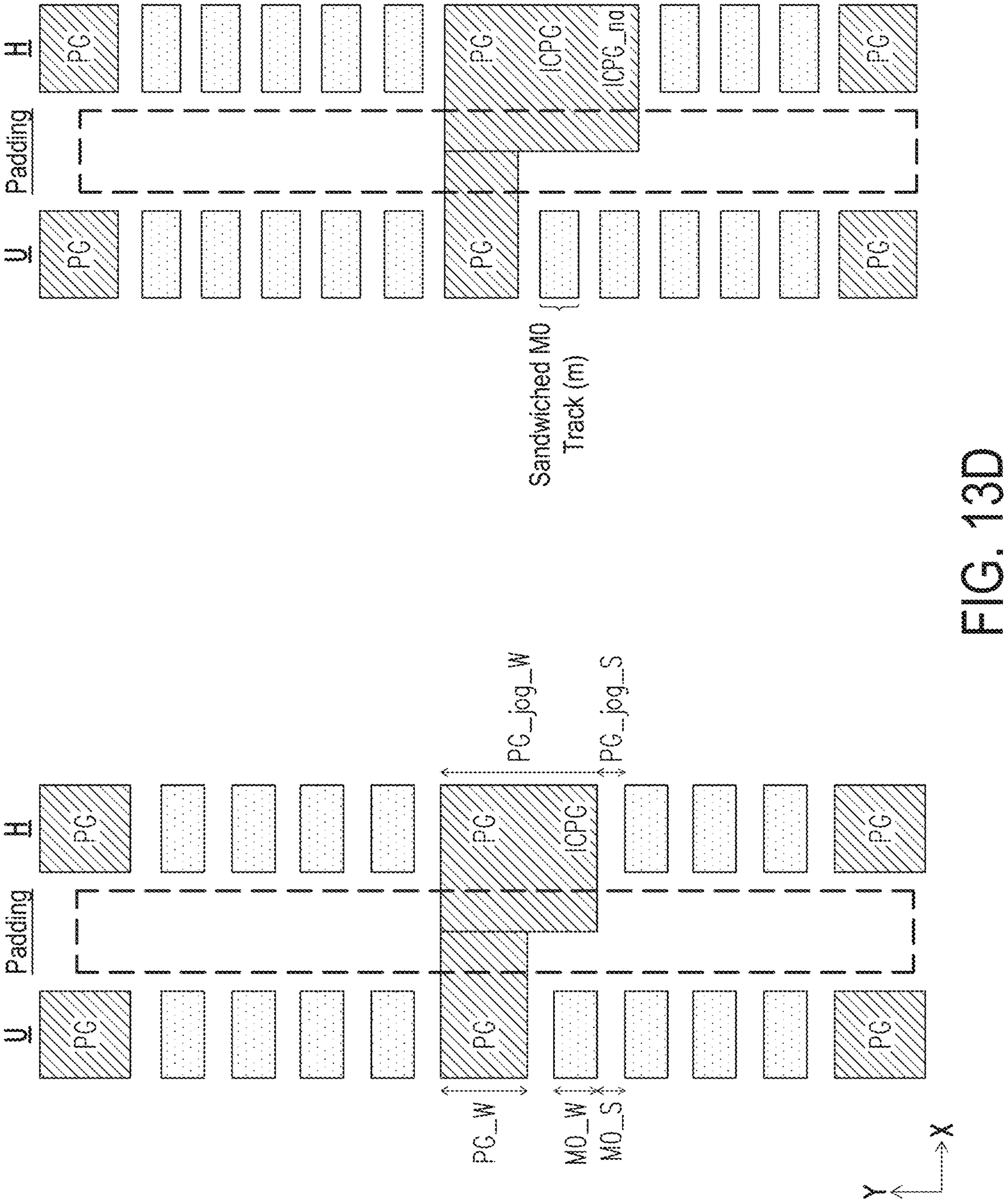

FIGS. 13C and 13D are illustrations of aspects of a padding cell connection with an integral structure according to an embodiment.

Referring to structures (a) and (b) in FIG. 13C, in some embodiments a padding cell ('Padding') is provided at each junction of a uniform-height cell ('U') with a hybrid-height cell ('H'). In some embodiments, a change in height (as determined parallel to the Y axis) of the integral ICPG track-PG rail is made at the padding cell 1600.

Referring to structure (b) in FIG. 13C, in some embodiments connection of the nonadjacent ICPG track ICPG_na with the PG rail by way of an integral conductive element in the M0 layer also results in connection of the sandwiched ICPG track ICPG. Thus, the use of the integral conductive element in the M0 layer to connect a non-adjacent PG rail such as ICPG_na may be reserved for cases in which an overall M0 routing resource is sufficient for large cell use.

Referring to FIG. 13D, in some embodiments an integral PG rail/ICPG structure is formed to satisfy the following relationships:

a ratio M0_W/M0_S is in a range of about 0.8 to about 1.2 a ratio PG_W/M0_W is in a range of about 1 to about 2.5

$$PG\_jog\_W < PG\_W + (m+1)*(M0\_S + M0\_W)$$

a ratio PG_jog_S/M0_S is greater than or equal to 1

For the above relationships, M0_W is the width of M0 as determined parallel to the Y axis; M0_S is the width of the M0 space (space between adjacent M0 tracks) as determined parallel to the Y axis; PG_W is the width of the (unexpanded) PG rail as determined parallel to the Y axis; PG_jog_W is width of the expanded PG rail, i.e., the integral PG rail/ICPG structure, as determined parallel to the Y axis; and 'm' represents the number of sandwiched M0 tracks 1100_*s*, i.e., the number of M0 tracks between the non-adjacent ICPG (ICPG_na) and the corresponding PG rail.

Figure 14:
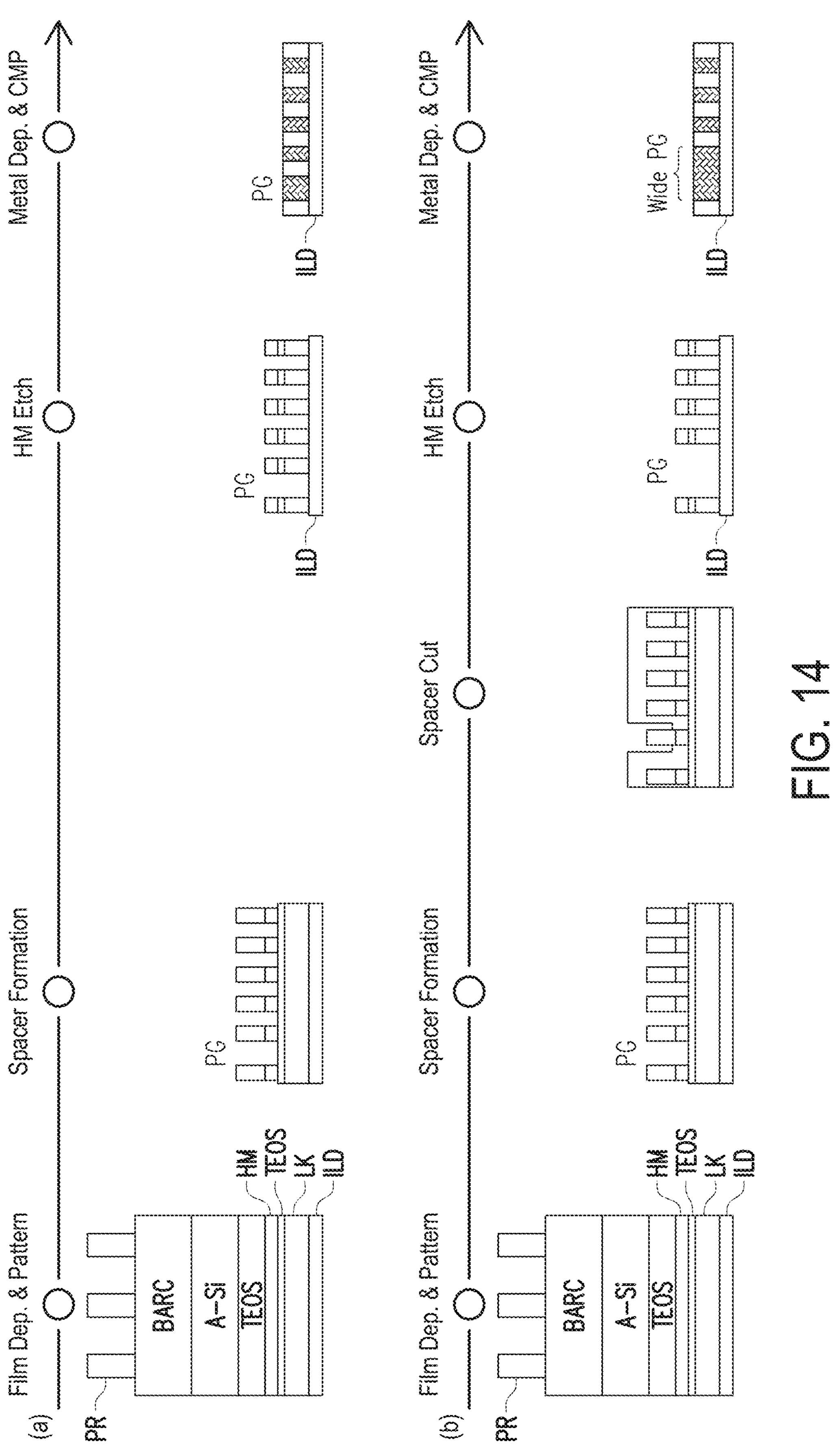
FIG. 14 is an illustration of aspects of an example process flow for forming a wide PG rail according to an embodiment.

FIG. 14 is an illustration of stages in a fabrication process according to an embodiment.

In FIG. 14, the ICPG track and the PG rail are formed as an integral conductive element, e.g., in the M0 layer, by modifying an M0 layer fabrication process. In FIG. 14, (a) is an illustration of an M0 layer fabrication process and (b) is an illustration of forming a wide PG rail, i.e., an integral PG rail/ICPG structure, by a modified M0 layer fabrication process according to an embodiment.

Referring to (a) in FIG. 14, in some embodiments an M0 layer fabrication process includes a film deposition and patterning operation, followed by a spacer formation operation, a hardmask etch operation, and a metal deposition and chemical mechanical polishing (CMP) operation.

In some embodiments, the film deposition and patterning operation includes forming a film stack. In some embodiments, the film stack includes an interlayer dielectric film (ILD), upon which are stacked, in sequence, a low-K dielectric film ('LK'), a first tetraethyl orthosilicate (TEOS) layer ('TEOS'), a hardmask layer ('HM'), a second TEOS layer ('TEOS'), an amorphous silicon layer ('A-Si'), a bottom anti-reflection coating (BARC) layer ('BARC'), and a photoresist ('PR') layer. In some embodiments, the photoresist layer is patterned and, in the spacer formation operation, the photoresist pattern is used in a first etch process to form a spacer pattern in which the second TEOS layer and the hardmask layer are patterned. In some embodiments, the remaining photoresist pattern, BARC layer, and A-Si layer are then removed. In some embodiments, the spacer pattern includes a pattern in the second TEOS and hardmask layers. In some embodiments, the hardmask etch operation forms a pattern in the first TEOS and low-K dielectric layers. In some embodiments, any remaining amorphous silicon, hardmask, and first TEOS layers are then removed. In some embodiments, the metal deposition and CMP operation includes depositing one or more metal layers on the pattern in the first TEOS and low-K dielectric layers, and chemical mechanical polishing the resultant structure until an uppermost surface of the low-K dielectric layer is formed and an uppermost surface of the resultant metal structure, which is the M0 layer in some embodiments, is exposed. In some embodiments, the depositing of one or more metal layers on the pattern in the first TEOS and low-K dielectric layers includes depositing a barrier layer and depositing a metal layer on the barrier layer. In some embodiments, the barrier layer helps to prevent diffusion of metal from the metal layer. In some embodiments, the barrier layer is or includes one or more of TaN or TiN. In some embodiments, the metal layer deposited on the barrier layer is or includes one or more of Cu or Co.

Referring to (b) in FIG. 14, a modified M0 layer fabrication process according to an embodiment includes the film deposition and patterning operation, followed by the spacer formation operation, as described above in connection with (a) in FIG. 14. Then, prior to proceeding with the hardmask etch operation and the metal deposition and chemical mechanical polishing (CMP) operations discussed above, in some embodiments a spacer cut operation is performed. That is, in some embodiments the modified M0 layer fabrication process includes the film deposition and patterning operation, followed by the spacer formation operation, the spacer cut operation, the hardmask etch operation, and the metal deposition and chemical mechanical polishing (CMP) operation.

In the modified M0 layer fabrication process according to an embodiment, the film deposition and patterning operation includes the forming of the film stack, and the spacer formation operation includes the forming of the spacer pattern, as described above in connection with (a) in FIG. 14.

In some embodiments, in the spacer cut operation a layer to be patterned is deposited on the spacer formation and a portion of the layer to be patterned is removed, e.g., by forming a second photoresist layer on the layer to be patterned, patterning the second photoresist layer to form a second photoresist pattern, and etching the layer to be patterned using the second photoresist layer to form a layer pattern that exposes a spacer of the spacer pattern. In some embodiments, the exposed spacer is then removed, e.g., by an etch process, while other spacers of the spacer pattern remain covered by and protected by the layer pattern.

Then, in some embodiments the hardmask etch and the metal deposition and CMP operations are performed in the manner discussed above in connection with (a) of FIG. 14.

As a result of the exposed spacer being removed, in some embodiments the metal deposition and CMP operations result in a structure in which a wide conductive element, i.e., a wide PG rail, is formed in the M0 layer.

Figure 15:
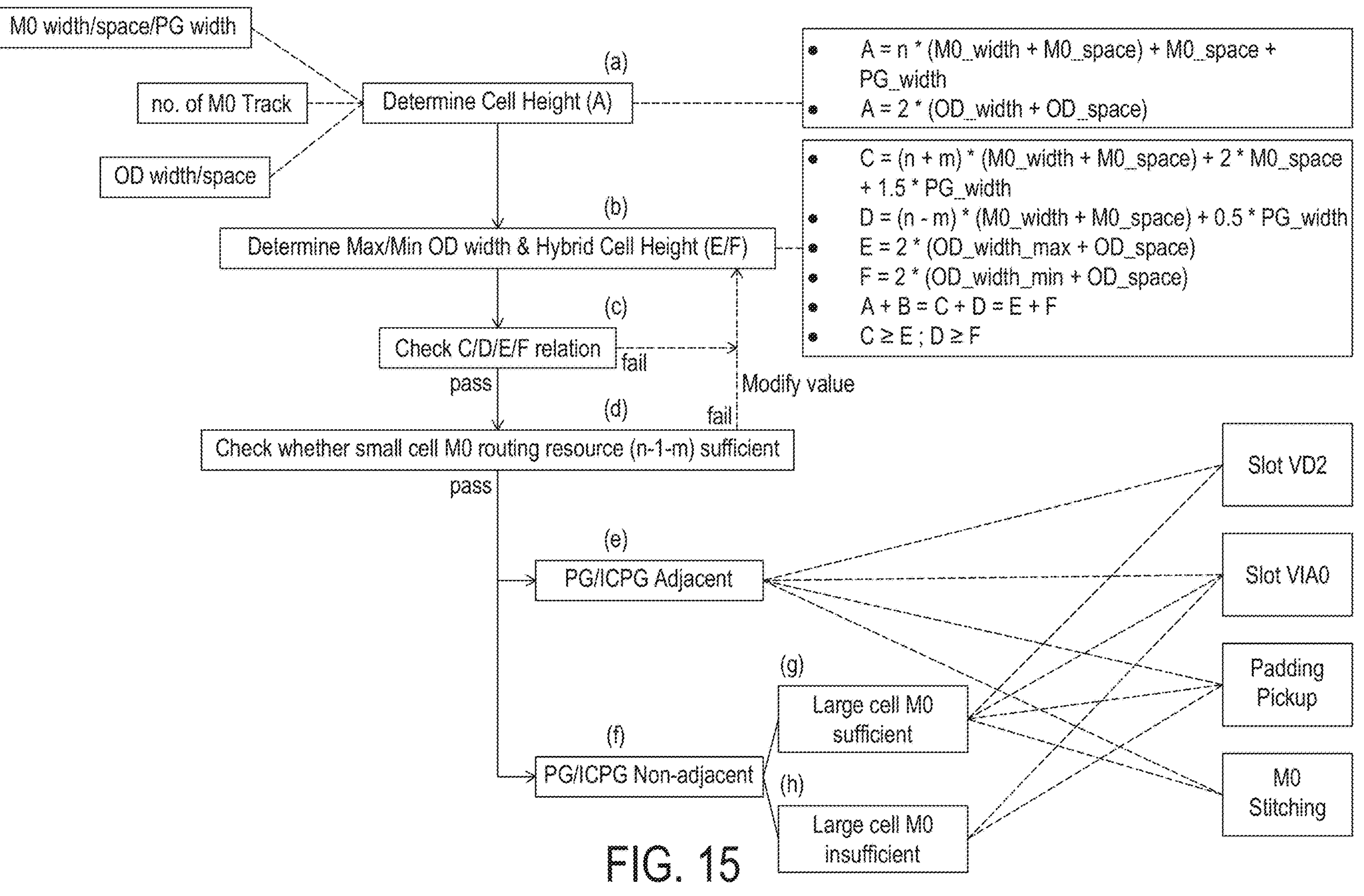
FIG. 15 is an illustration of aspects of designing a layout according to an embodiment.

FIG. 15 is an illustration of aspects of designing a layout according to an embodiment.

Referring to FIG. 15 (and with additional reference to FIG. 8), designing a layout according to an embodiment includes an operation (a) of determining a cell height ‘A’. In some embodiments, the determining of the cell height ‘A’ takes into consideration the width of the M0 tracks (M0_width), the width of the M0 space (M0_space), the width of the PG rail (PG_width), the number of M0 tracks (n), the OD width (OD_width), and the width of the OD space (OD_space).

In some embodiments, the cell height, i.e., the dimension ‘A’, satisfies the following relationships:

$$A = n*(M0\text{ width} + M0\text{ space}) + M0\text{ space} + PG\text{ width}$$

$$A = 2*(OD\text{ width} + OD\text{ space})$$

In some embodiments, designing the layout further includes, after the cell height ‘A’ has been determined, an operation (b) of determining a maximum OD width, determining a minimum OD width, and determining cell heights of a hybrid-cell structure.

In some embodiments, the determined values for the maximum OD width, the minimum OD width, and the cell heights of the hybrid-cell structure are evaluated (the cell heights of the hybrid-cell structure are denoted by dimensions E and F in FIG. 8.). For example, referring to FIG. 8, in some embodiments the dimension ‘B’ is set to be equal to ‘A’, and the dimensions ‘A’, ‘B’, ‘C’, ‘D’, ‘E’, and ‘F’ as set forth in FIG. 8 are checked (operation (c)) to determine whether they satisfy the following relationships:

$$A = n*(M0\text{ width} + M0\text{ space}) + M0\text{ space} + PG\text{ width}$$

$$A = 2*(OD\text{ width} + OD\text{ space})$$

-continued $$C = (n+m)*(M0\text{ width} + M0\text{ space}) + 2*M0\text{ space} + 1.5*PG\text{ width}$$

$$D = (n-m)*(M0\text{ width} + M0\text{ space}) + 0.5*PG\text{ width}$$

$$E = 2*(OD\text{ width\_lg} + OD\text{ space})$$

$$F = 2*(OD\text{ width\_sm} + OD\text{ space})$$

$$A + B = C + D = E + F$$

$$C \geq E$$

$$D \geq F$$

For the above relationships, the terms ‘M0 width’, ‘M0 space’, and ‘PG width’ are as shown in FIG. 7. Also, ‘n’ represents the number of M0 tracks 1100, as shown in FIG. 7; ‘m’ represents the number of sandwiched M0 tracks 1100_*s*, i.e., the number of M0 tracks between non-adjacent ICPG (ICPG_na) and the corresponding PG rail; and ‘OD width_lg’ represents the larger OD width and ‘OD width_sm’ represents the smaller OD width in the hybrid-cell structures ‘H’ and ‘H_2’.

If the above relationships for ‘A’ through ‘F’ are not satisfied, in some embodiments one or more values of the layout design is modified, e.g., by modifying one or more of the maximum OD width, the minimum OD width, and the cell heights of the hybrid-cell structure, and then the dimensions ‘A’ through ‘F’ are reevaluated (operation (c)) to determine whether they satisfy the above relationships.

In some embodiments, designing the layout further includes, after the dimensions ‘A’ through ‘F’ pass the evaluation in operation (c), an operation (d) of checking to see whether a small cell (F in FIG. 8) M0 routing resource (n-1-m) is sufficient (as discussed above, ‘n’ represents the number of M0 tracks and ‘m’ represents the number of sandwiched M0 tracks).

In some embodiments, if the small cell M0 routing resource is not found to be sufficient, the layout design is modified, e.g., by modifying one or more of the maximum OD width, the minimum OD width, and the cell heights of the hybrid-cell structure, and reevaluating the same.

In some embodiments, designing the layout further includes, after the small cell M0 routing resource is found to be sufficient, determining which M0 tracks are to be designated as ICPG tracks, including designating M0 tracks as adjacent (operation (e); see also ICPG_a of FIG. 8) or non-adjacent (operation (f); see also ICPG_na of FIG. 8).

In some embodiments, designing the layout further includes, for adjacent ICPG tracks (e.g., ICPG_a of FIG. 8), selecting a connection structure for providing power/ground to the adjacent ICPG track, e.g., connecting the adjacent ICPG track with the PG rail. In some embodiments, the connection structure is, e.g., a slot VD2 connection structure, a slot VIA0 connection structure, a padding pickup connection structure, or an M0 stitching connection structure. In some embodiments, other routing structures are used. An example of the slot VD2 connection structure is described above with reference to FIGS. 10A-10D. An example of the slot VIA0 connection structure is described above with reference to FIGS. 11A-11D. An example of the padding pickup connection structure is described above with reference to FIGS. 12A-12C. An example of the M0 stitching connection structure is described above with reference to FIGS. 13A-13D and 8.

In some embodiments, designing the layout further includes, for non-adjacent ICPG tracks (e.g., ICPG_na of FIG. 8), selecting a connection structure for providing power/ground to the non-adjacent ICPG track, e.g., connecting the non-adjacent ICPG track with the PG rail.

In some embodiments, for cases in which non-adjacent ICPG tracks are implemented and it is considered that a large cell M0 routing resource is sufficient (see (g) in FIG. 15), the connection structure is, e.g., the slot VD2 connection structure, the slot VIA0 connection structure, the padding pickup connection structure, or the M0 stitching connection structure. In some embodiments, other routing structures are used.

In some embodiments, for cases in which non-adjacent ICPG tracks are implemented and it is considered that a large cell M0 routing resource may not be sufficient (see (h) in FIG. 15), the connection structure is, e.g., the slot VIA0 connection structure or the padding pickup connection structure. In some embodiments, other routing structures are used.

Figure 16:
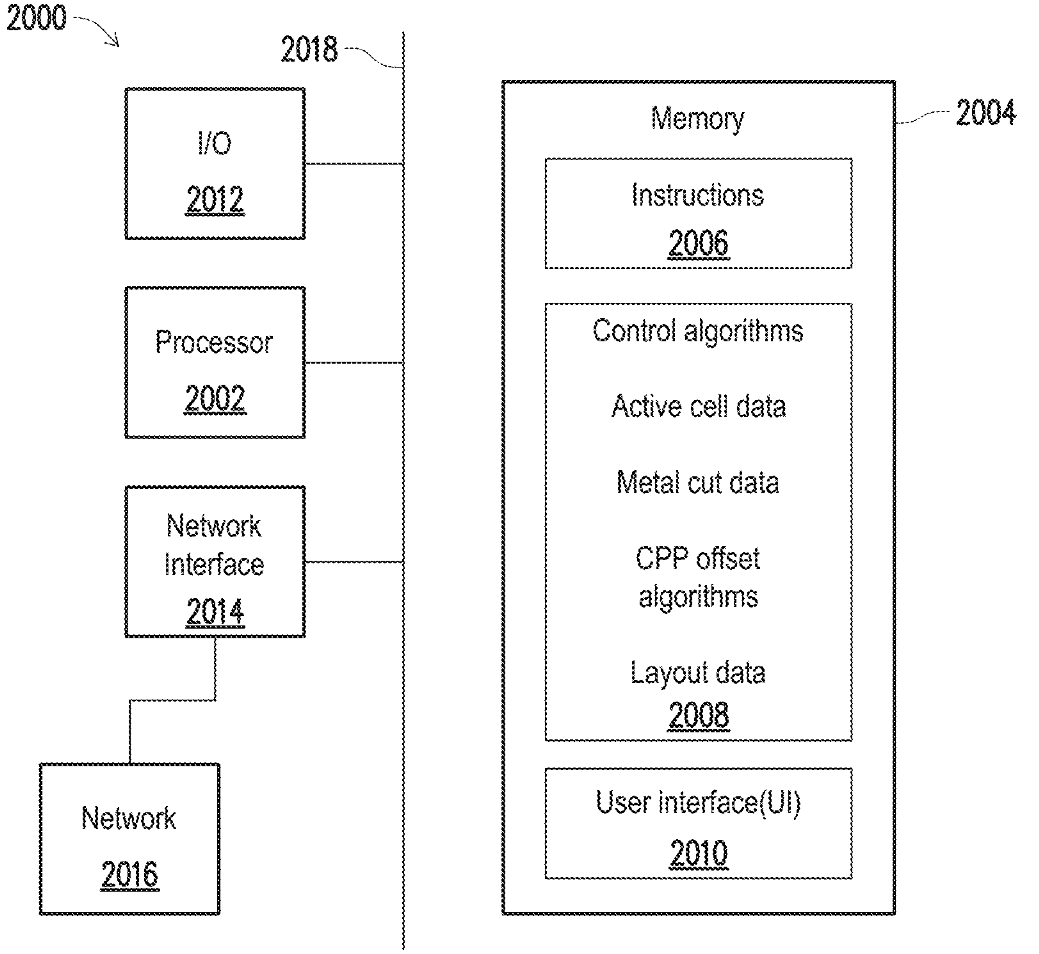
FIG. 16 is a block diagram of an electronic process control (EPC) system according to an embodiment.

FIG. 16 is a block diagram of an electronic process control (EPC) system according to an embodiment.

FIG. 16 is a block diagram of an electronic process control (EPC) system 2000 according to an embodiment. In some embodiments, methods described herein of generating cell layout diagrams, according to one or more embodiments, are implemented using the EPC system 2000. In some embodiments, the EPC system 2000 is, e.g., a general purpose computing device including a hardware processor 2002 and a non-transitory, computer-readable storage medium 2004. In some embodiments, the computer-readable storage medium 2004, amongst other things, is encoded with, i.e., stores, computer program code (or instructions) 2006, i.e., a set of executable instructions. In some embodiments, execution of computer program code 2006 by the processor 2002 represents, at least in part, an EPC tool that implements a portion, or all, of the methods described herein accordance to one or more embodiments (hereinafter, the noted processes and/or methods).

In some embodiments, the processor 2002 is electrically coupled to the computer-readable storage medium 2004 via a bus 2018. In some embodiments, the processor 2002 is also electrically coupled to an I/O interface 2012 by the bus 2018. In some embodiments, a network interface 2014 is also electrically connected to the processor 2002 via the bus 2018. In some embodiments, the network interface 2014 is connected to a network 2016, and the processor 2002 and the computer-readable storage medium 2004 connect to external elements via the network 2016. In some embodiments, the processor 2002 is configured to execute the computer program code 2006 encoded in the computer-readable storage medium 2004 in order to cause the EPC system 2000 to be usable for performing a portion or all of the noted processes and/or methods. In some embodiments, the processor 2002 is, e.g., a central processing unit (CPU), a multi-processor, a distributed processing system, an application specific integrated circuit (ASIC), and/or a suitable processing unit.

In some embodiments, the computer-readable storage medium 2004 is, e.g., an electronic, magnetic, optical, electromagnetic, infrared, and/or a semiconductor system (or apparatus or device). In some embodiments, the computer-readable storage medium 2004 includes, e.g., a semiconductor or solid-state memory, a magnetic tape, a removable computer diskette, a random-access memory (RAM), a read-only memory (ROM), a rigid magnetic disk, and/or an optical disk such as a compact disk-read only memory (CD-ROM), a rewritable compact disk (CD-R/W), and/or a digital video disc or digital versatile disc (DVD).

In some embodiments, the computer-readable storage medium 2004 stores the computer program code 2006 that is configured to cause the EPC system 2000 (where such execution represents (at least in part) the EPC tool) to be usable for performing a portion or all of the noted processes and/or methods. In some embodiments, the computer-readable storage medium 2004 also stores information that facilitates performing a portion or all of the noted processes and/or methods. In some embodiments, the computer-readable storage medium 2004 stores process control data 2008 that includes, e.g., control algorithms, active area data, transition cell data, uniformity algorithms, layout data, constants, target ranges, set points, and code for enabling statistical process control (SPC) and/or model predictive control (MPC) based control of the various processes.

In some embodiments, the EPC system 2000 includes an I/O interface 2012. In some embodiments, the I/O interface 2012 is coupled to external circuitry. In some embodiments, the I/O interface 2012 includes, e.g., a keyboard, keypad, mouse, trackball, trackpad, touchscreen, and/or cursor direction keys for communicating information and commands to the processor 2002.

In some embodiments, in the EPC system 2000, the network interface 2014 is coupled to the processor 2002. In some embodiments, the network interface 2014 allows the EPC system 2000 to communicate with the network 2016, to which one or more other computer systems may be connected. In some embodiments, the network interface 2014 implements wireless network interfaces such as BLUETOOTH, WIFI, WIMAX, GPRS, and/or WCDMA; and/or wired network interfaces such as ETHERNET, USB, and/or IEEE-1364. In some embodiments, a portion or all of noted processes and/or methods are implemented in two or more of the EPC systems 2000.

In some embodiments, the EPC system 2000 is configured to receive information through the I/O interface 2012. In some embodiments, the information received through the I/O interface 2012 includes, e.g., instructions, data, design rules, process performance histories, target ranges, set points, and/or other parameters for processing by the processor 2002. In some embodiments, the information is transferred to the processor 2002 via the bus 2018. In some embodiments, the EPC system 2000 is configured to receive information related to a user interface (UI) through the I/O interface 2012. In some embodiments, the information is stored in the computer-readable storage medium 2004 as a user interface (UI) 2010.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, one or more of the noted processes and/or methods is implemented as a software application that is a portion of an EPC tool. In some embodiments, a portion or all of the noted processes and/or methods is implemented as a software application that is used by the EPC system 2000.

In some embodiments, the noted processes and/or methods are realized as functions of a program stored in a non-transitory computer-readable recording medium such as an external/removable and/or internal/built-in storage or memory unit, e.g., one or more of an optical disk such as a DVD, a magnetic disk such as a hard disk, a semiconductor memory such as a ROM or a RAM, a memory card, or the like.

Figure 17:
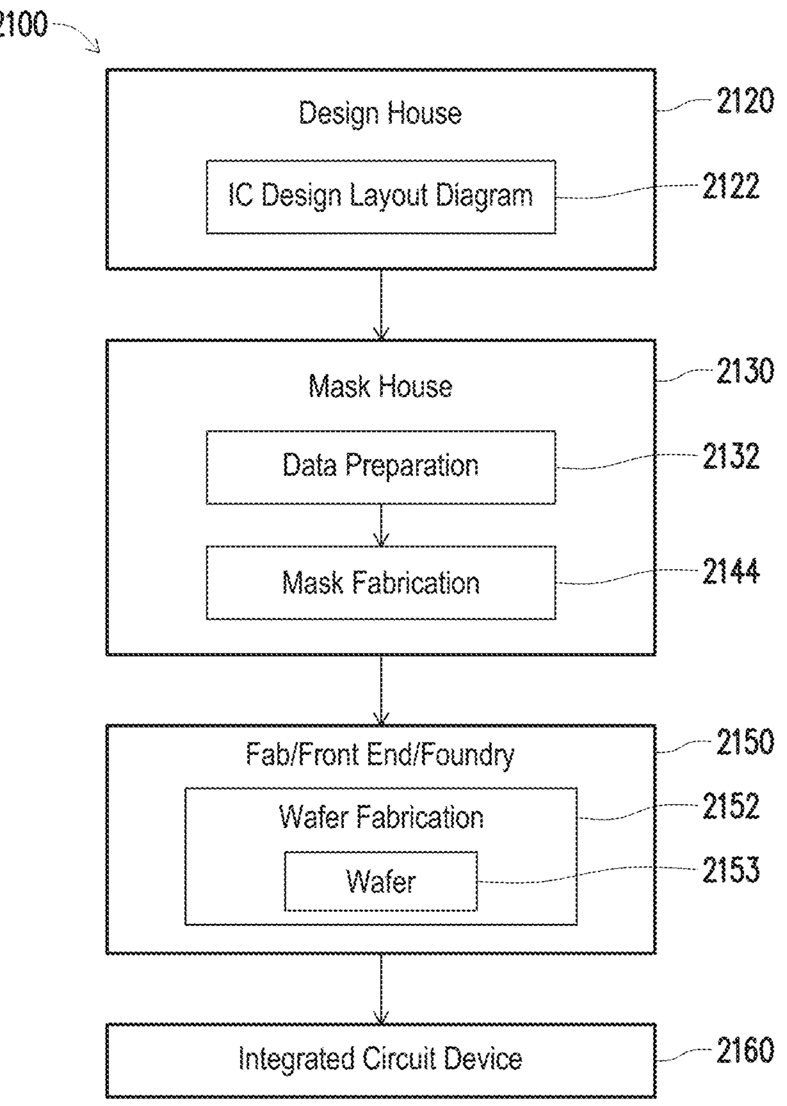
FIG. 17 is a block diagram of an IC manufacturing system according to an embodiment.

FIG. 17 is a block diagram of an IC manufacturing system according to an embodiment.

FIG. 17 is a block diagram of an integrated circuit (IC) manufacturing system 2100, and an IC manufacturing flow associated therewith, accordance to some embodiments. Based on a layout diagram according to an embodiment, a semiconductor mask and/or a component in a layer of a semiconductor integrated circuit is fabricated using the IC manufacturing system 2100 according to an embodiment. In some embodiments, the IC manufacturing flow implements, e.g., the aspects of designing a layout according to an embodiment as discussed above in connection with FIG. 15.

In some embodiments, the IC manufacturing system 2100 includes entities, e.g., a design house (or design team) 2120, a mask house 2130, and an IC manufacturer/fabricator (FAB or fab) 2150, that interact with one another in the design, development, and manufacturing cycles and/or services related to manufacturing an IC device 2160. In some embodiments, the entities in the IC manufacturing system 2100 are connected by a communications network. In some embodiments, the communications network is, e.g., a single network or a variety of different networks, such as an intranet and the Internet. In some embodiments, the communications network includes wired and/or wireless communication channels. In some embodiments, each entity interacts with one or more of the other entities, and provides services to and/or receive services from one or more of the other entities. In some embodiments, two or more of the design house 2120, the mask house 2130, and the IC fab 2150 are owned by a single larger company. In some embodiments, two or more of the design house 2120, the mask house 2130, and the IC fab 2150 coexist in a common facility and use common resources.

In some embodiments, the design house 2120 generates an IC design layout diagram 2122. In some embodiments, the IC design layout diagram 2122 includes various geometrical patterns designed for the IC device 2160. In some embodiments, the geometrical patterns correspond to patterns of, e.g., metal, oxide, or semiconductor layers that make up the various components of the IC device 2160 to be fabricated. In some embodiments, the various patterns combine to form various IC features. For example, in some embodiments, a portion of the IC design layout diagram 2122 includes various IC features (such as an active region, gate electrode, source and drain, metal lines or vias of an interlayer interconnection, and openings for bonding pads) to be formed in a semiconductor substrate (such as a silicon wafer) and various material layers disposed on the semiconductor substrate. In some embodiments, the design house 2120 implements a design procedure to form the IC design layout diagram 2122. In some embodiments, the design procedure includes, e.g., logic design, physical design, and/or place and route. In some embodiments, the IC design layout diagram 2122 is presented or embodied in one or more data files having information of the geometrical patterns. For example, in some embodiments the IC design layout diagram 2122 is expressed in a GDSII file format or a DFII file format.

In some embodiments, the mask house 2130 includes operations of mask data preparation 2132 and mask fabrication 2144. In some embodiments, the mask house 2130 uses the IC design layout diagram 2122 to manufacture one or more masks to be used for fabricating the various layers of the IC device 2160 according to the IC design layout diagram 2122. In some embodiments, the mask house 2130 performs the mask data preparation 2132, where the IC design layout diagram 2122 is translated into a representative data file (RDF). In some embodiments, the mask data preparation 2132 provides the RDF to the mask fabrication 2144. In some embodiments, the mask fabrication 2144 includes a mask writer. In some embodiments, the mask writer converts the RDF to an image on a substrate, such as a mask (reticle) or a semiconductor wafer 2153. In some embodiments, the IC design layout diagram 2122 is manipulated by the mask data preparation 2132 to comply with particular characteristics of the mask writer and/or requirements of the IC fab 2150. Although the mask data preparation 2132 and the mask fabrication 2144 are illustrated as separate elements, in some embodiments, the mask data preparation 2132 and the mask fabrication 2144 are collectively referred to as mask data preparation.

In some embodiments, the mask data preparation 2132 includes optical proximity correction (OPC) that uses lithography enhancement techniques to compensate for image errors, such as those that arise from diffraction, interference, other process effects, or the like. In some embodiments, the OPC adjusts the IC design layout diagram 2122. In some embodiments, the mask data preparation 2132 further includes resolution enhancement techniques (RET) such as off-axis illumination, sub-resolution assist features, phase-shifting masks, other suitable techniques, combinations thereof, or the like. In some embodiments, an inverse lithography technology (ILT) is also used, which treats OPC as an inverse imaging problem.

In some embodiments, the mask data preparation 2132 includes a mask rule checker (MRC) that checks the IC design layout diagram 2122, which has undergone processes in OPC, with a set of mask creation rules that contain geometric and/or connectivity restrictions, e.g., to ensure sufficient margins, to account for variability in semiconductor manufacturing processes, or the like. In some embodiments, the MRC modifies the IC design layout diagram 2122 to compensate for limitations during mask fabrication 2144, which in some embodiments undoes part of the modifications performed by OPC in order to meet mask creation rules.

In some embodiments, the mask data preparation 2132 includes lithography process checking (LPC) that simulates processing that will be implemented by the IC fab 2150 to fabricate the IC device 2160. In some embodiments, the LPC simulates this processing based on the IC design layout diagram 2122 to create a simulated manufactured device, such the IC device 2160. In some embodiments, the processing parameters in the LPC simulation includes parameters associated with various processes of the IC manufacturing cycle, parameters associated with tools used for manufacturing the IC, and/or other aspects of the manufacturing process. In some embodiments, the LPC takes into account various factors, such as aerial image contrast, depth of focus (DOF), mask error enhancement factor (MEEF), other suitable factors, combinations thereof, or the like. In some embodiments, after the simulated manufactured device has been created by the LPC, if the simulated device is not close enough in shape to satisfy the design rules, the OPC and/or the MRC is repeated to further refine the IC design layout diagram 2122.

The above description of the mask data preparation 2132 has been simplified for the purposes of clarity. It will be appreciated that the mask data preparation 2132 may include additional features such as a logic operation (LOP) to modify the IC design layout diagram 2122 according to manufacturing rules. Additionally, the processes applied to the IC design layout diagram 2122 during the mask data preparation 2132 may be executed in a variety of different orders.

In some embodiments, after the mask data preparation 2132 and during the mask fabrication 2144, the mask or a group of the masks are fabricated based on the modified IC design layout diagram 2122. In some embodiments, the mask fabrication 2144 includes performing one or more lithographic exposures based on the IC design layout diagram 2122. In some embodiments, an electron-beam (e-beam) or a mechanism of multiple e-beams is used to form a pattern on the mask (photomask or reticle) based on the modified IC design layout diagram 2122. In some embodiments, the mask is formed using various technologies. In some embodiments, the mask is formed using binary technology. In some embodiments, a mask pattern includes, e.g., opaque regions and transparent regions. In some embodiments, a radiation beam, such as an ultraviolet (UV) beam, is used to expose an image sensitive material layer (e.g., a photoresist) that has been coated on a wafer. In some embodiments, the radiation beam is blocked by the opaque region and transmitted through the transparent regions. In one example, a binary mask version of the mask includes a transparent substrate (e.g., fused quartz) and an opaque material (e.g., chrome) coated in the opaque regions of the binary mask. In another example, the mask is formed using a phase shift technology. In some embodiments, in a phase shift mask (PSM) version of the mask, various features in a pattern formed on the phase shift mask are configured to have a phase difference to enhance the resolution and imaging quality. In some embodiments, the phase shift mask is, e.g., an attenuated PSM, an alternating PSM, or the like. In some embodiments, the mask is used in a variety of processes, e.g., an ion implantation process to form various doped regions in semiconductor wafer 2153, an etching process to form various etching regions in semiconductor wafer 2153, or the like.

In some embodiments, the IC fab 2150 performs wafer fabrication 2152. In some embodiments, the IC fab 2150 is a semiconductor foundry. In some embodiments, the IC fab 2150 is an IC fabrication business that includes one or more manufacturing facilities for the fabrication of a variety of different IC products. For example, in some embodiments the IC fab 2150 includes one or more of a manufacturing facility for front-end fabrication of an IC product (front-end-of-line (FEOL) fabrication), a manufacturing facility for back-end fabrication (e.g., interconnection and packaging) of an IC product (back-end-of-line (BEOL) fabrication), a manufacturing facility for other services, or the like.

In some embodiments, a device includes: first, second, and third power/ground (PG) conductive elements extending in a first direction; a first set of at least three conductive tracks between the first and second PG conductive elements and a second set of at least three conductive tracks between the second and third PG conductive elements, the conductive tracks being arranged in equal numbers between the first and second PG conductive elements and between the second and third PG conductive elements; a first row of cells arranged in the first direction and overlapping the first set of at least three conductive tracks; and a second row of cells arranged in the first direction and overlapping the second set of at least three conductive tracks. In some embodiments, in the first row of cells, a first cell has a first height in a second direction, orthogonal to the first direction, n the first row of cells, a second cell has a height that is greater than the first height, in the second row of cells, a third cell shares a boundary extending in the first direction with the first cell and has the first height, in the second row of cells, a fourth cell shares a boundary extending in the first direction with the second cell and has a height less than the first height, combined heights of the second and fourth cells corresponding to combined heights of the first and third cells, and, between the second and third PG conductive elements, a conductive track is aligned with a boundary, extending in the first direction, of the second and fourth cells and is configured as an in-cell PG track. In some embodiments, the first and second rows of cells each have at least one active region formed in a substrate, the at least one active region extending in the first direction, and the conductive tracks are in a lowermost conductive material layer over the substrate. In some embodiments, all of the conductive tracks have a same dimension in the second direction. In some embodiments, the first cell has a first active region extending in the first direction, the second cell has a second active region extending in the first direction, and a first isolating pattern isolates the first active region from the second active region, the first isolating pattern extending in the second direction; and the third cell has a third active region extending in the first direction, the fourth cell has a fourth active region extending in the first direction, and a second isolating pattern isolates the third active region, the second isolating pattern extending in the second direction. In some embodiments, the second isolating pattern is aligned with the first isolating pattern. In some embodiments, the first isolating pattern and the second isolating pattern are each a continuous polysilicon on oxide definition edge (CPODE) pattern. In some embodiments, the first cell has a first active region extending in the first direction, the second cell has a second active region extending in the first direction, and a dimension of the first active region in the second direction is less than a dimension of the second active region in the second direction; and the third cell has a third active region extending in the first direction, the fourth cell has a fourth active region extending in the first direction, and a dimension of the third active region in the second direction is greater than a dimension of the fourth active region in the second direction. In some embodiments, the second PG conductive element is aligned with a boundary, extending in the second direction, of the first and third cells. In some embodiments, the in-cell PG track is electrically connected to the second PG conductive element by a connection that is located in the third cell or between the second cell and the third cell. In some embodiments, the fourth cell includes a transistor, and the in-cell PG track is electrically connected to a source of the transistor.

In some embodiments, a device includes first, second, and third Power/Ground (PG) conductive elements extending in a first direction; a first set of at least three conductive tracks between the first and second PG conductive elements and a second set of at least three conductive tracks between the second and third PG conductive elements, the conductive tracks being arranged in equal numbers between the first and second PG conductive elements and between the second and third PG conductive elements; a first cell having a first height in a second direction, orthogonal to the first direction, and overlapping all of the first set of at least three conductive tracks; a second cell having a second height, and overlapping all of the first set of at least three conductive tracks and overlapping at least one conductive track of the second set of at least three conductive tracks such that the second height is greater than the first height; a third cell overlapping all of the second set of at least three M0 tracks and having the first height such that the first and third cells have the same heights; and a fourth cell having a fourth height overlapping less than all conductive tracks of the second set of at least three conductive tracks, combined heights of the first and third cells being the same as combined heights of the second and fourth cells. In some embodiments, in the fourth cell: a conductive track is configured as an in-cell PG track that extends in the first direction, and the in-cell PG track is electrically connected to a source of the transistor. In some embodiments, the first PG conductive element, the second PG conductive element, the third PG conductive element, the first set of at least three conductive tracks, and the second set of at least three conductive tracks are formed in a same first layer, and the in-cell PG track is connected to the second PG conductive element by an extended via connection that extends in the second direction and contacts the in-cell PG track and the second PG conductive element. In some embodiments, the first, second, third, and fourth cells each have at least one active region formed in a substrate, a metal over diffusion layer is over the active regions, the first layer is a lowermost conductive material layer over the metal over diffusion layer, and the extended via connection is aligned with a metal over diffusion element, and is between the metal over diffusion element and the first layer. In some embodiments, the first, second, third, and fourth cells each have at least one active region formed in a substrate, the fourth cell includes a transistor having a gate, the extended via connection is aligned with the gate and is between the gate and the first layer. In some embodiments, a padding cell extends in the second direction between the first cell and the third cell and between the second cell and the fourth cell, the in-cell PG track and the second PG conductive element are electrically connected by a connection that is located in the padding cell. In some embodiments, the first PG conductive element, the second PG conductive element, the third PG conductive element, the first set of at least three conductive tracks, and the second set of at least three conductive tracks are formed in a same first layer, the first, second, third, and fourth cells each have at least one active region formed in a substrate, a metal over diffusion layer is over the active regions, the first layer is a lowermost conductive material layer over the metal over diffusion layer, and the connection is aligned with a metal over diffusion element in the padding cell, and is between the metal over diffusion element and the first layer. In some embodiments, a height in the second direction of the second PG conductive element changes in the padding cell, and in the fourth cell, the second PG conductive element and the in-cell PG track are integral along the first direction.

In some embodiments, a method of fabricating an integrated circuit device includes: forming first, second, and third power/ground (PG) conductive elements extending in a first direction; forming a first set of at least three conductive tracks between the first and second PG conductive elements and a second set of at least three conductive tracks between the second and third PG conductive elements, the conductive tracks being formed in equal numbers between the first and second PG conductive elements and between the second and third PG conductive elements; forming circuits in a first row of cells arranged in the first direction and overlapping the first set of at least three conductive tracks; and forming circuits in a second row of cells arranged in the first direction and overlapping the second set of at least three conductive tracks. In some embodiments, in the first row of cells, a first cell has a first height in a second direction, orthogonal to the first direction, in the first row of cells, a second cell has a height that is greater than the first height, in the second row of cells, a third cell shares a boundary extending in the first direction with the first cell and has the first height, in the second row of cells, a fourth cell shares a boundary extending in the first direction with the second cell and has a height less than the first height, combined heights of the second and fourth cells corresponding to combined heights of the first and third cells, and between the second and third PG conductive elements, a conductive track is aligned with a boundary, extending in the first direction, of the second and fourth cells and is formed as an in-cell PG track. In some embodiments, the forming circuits in the first row of cells includes forming a first transistor in the second cell such that a source of the first transistor is electrically connected to the in-cell PG track; the forming circuits in the second row of cells includes forming a second transistor in the fourth cell such that a source of the second transistor is electrically connected to the in-cell PG track; and the forming the in-cell PG track includes at least one of forming a first electrical connection or forming a second electrical connection to electrically connect the in-cell PG track with the second PG conductive element. In some embodiments, the forming the first electrical connection includes: forming an extended via connection that extends in the second direction and connects the in-cell PG track and the second PG conductive element, wherein the first PG conductive element, the second PG conductive element, the third PG conductive element, the first set of at least three conductive tracks, and the second set of at least three conductive tracks are formed in a same conductive layer. In some embodiments, the forming the second electrical connection includes: forming a connection that connects the in-cell PG track and the second PG conductive element, wherein the connection is formed in a padding cell that extends in the second direction between the first cell and the third cell and between the second cell and the fourth cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:

first, second, and third power/ground (PG) conductive elements extending in a first direction;

a first set of at least three conductive tracks between the first and second PG conductive elements and a second set of at least three conductive tracks between the second and third PG conductive elements, the conductive tracks being arranged in equal numbers between the first and second PG conductive elements and between the second and third PG conductive elements;

a first row of cells arranged in the first direction and overlapping the first set of at least three conductive tracks; and a second row of cells arranged in the first direction and overlapping the second set of at least three conductive tracks;

wherein:

in the first row of cells, a first cell has a first height in a second direction, orthogonal to the first direction, in the first row of cells, a second cell has a height that is greater than the first height, in the second row of cells, a third cell shares a boundary extending in the first direction with the first cell and has the first height, in the second row of cells, a fourth cell shares a boundary extending in the first direction with the second cell and has a height less than the first height, combined heights of the second and fourth cells corresponding to combined heights of the first and third cells, and between the second and third PG conductive elements, a conductive track is aligned with a boundary, extending in the first direction, of the second and fourth cells and is configured as an in-cell PG track.

2. The device of claim 1, wherein:

the first and second rows of cells each have at least one active region formed in a substrate, the at least one active region extending in the first direction, and the conductive tracks are in a lowermost conductive material layer over the substrate.

3. The device of claim 1, wherein all of the conductive tracks have a same dimension in the second direction.

4. The device of claim 1, wherein:

the first cell has a first active region extending in the first direction, the second cell has a second active region extending in the first direction, and a first isolating pattern isolates the first active region from the second active region, the first isolating pattern extending in the second direction; and the third cell has a third active region extending in the first direction, the fourth cell has a fourth active region extending in the first direction, and a second isolating pattern isolates the third active region, the second isolating pattern extending in the second direction.

5. The device of claim 4, wherein the second isolating pattern is aligned with the first isolating pattern.

6. The device of claim 4, wherein the first isolating pattern and the second isolating pattern are each a continuous polysilicon on oxide definition edge (CPODE) pattern.

7. The device of claim 1, wherein:

the first cell has a first active region extending in the first direction, the second cell has a second active region extending in the first direction, and a dimension of the first active region in the second direction is less than a dimension of the second active region in the second direction; and the third cell has a third active region extending in the first direction, the fourth cell has a fourth active region extending in the first direction, and a dimension of the third active region in the second direction is greater than a dimension of the fourth active region in the second direction.

8. The device of claim 1, wherein the second PG conductive element is aligned with a boundary, extending in the second direction, of the first and third cells.

9. The device of claim 1, wherein the in-cell PG track is electrically connected to the second PG conductive element by a connection in the third cell or between the second cell and the third cell.

10. The device of claim 1, wherein the fourth cell includes a transistor, and the in-cell PG track is electrically connected to a source of the transistor.

11. A device comprising:

first, second, and third Power/Ground (PG) conductive elements extending in a first direction;

a first set of at least three conductive tracks between the first and second PG conductive elements and a second set of at least three conductive tracks between the second and third PG conductive elements, the conductive tracks being arranged in equal numbers between the first and second PG conductive elements and between the second and third PG conductive elements;

a first cell having a first height in a second direction, orthogonal to the first direction, and overlapping all of the first set of at least three conductive tracks;

a second cell having a second height, and overlapping all of the first set of at least three conductive tracks and overlapping at least one conductive track of the second set of at least three conductive tracks such that the second height is greater than the first height;

a third cell overlapping all of the second set of at least three M0 tracks and having the first height such that the first and third cells have the same heights; and a fourth cell having a fourth height overlapping less than all conductive tracks of the second set of at least three conductive tracks, combined heights of the first and third cells being the same as combined heights of the second and fourth cells.

12. The device of claim 11, wherein, in the fourth cell:

a conductive track is configured as an in-cell PG track that extends in the first direction, and the in-cell PG track is electrically connected to a source of the transistor.

13. The device of claim 12, wherein:

the first PG conductive element, the second PG conductive element, the third PG conductive element, the first set of at least three conductive tracks, and the second set of at least three conductive tracks are formed in a same first layer, and the in-cell PG track is connected to the second PG conductive element by an extended via connection that extends in the second direction and contacts the in-cell PG track and the second PG conductive element.

14. The device of claim 13, wherein:

the first, second, third, and fourth cells each have at least one active region formed in a substrate, a metal over diffusion layer is over the active regions, the first layer is a lowermost conductive material layer over the metal over diffusion layer, and the extended via connection is aligned with a metal over diffusion element, and is between the metal over diffusion element and the first layer.

15. The device of claim 13, wherein:

the first, second, third, and fourth cells each have at least one active region formed in a substrate, the fourth cell includes a transistor having a gate, the extended via connection is aligned with the gate and is between the gate and the first layer.

16. The device of claim 12, wherein:

a padding cell extends in the second direction between the first cell and the third cell and between the second cell and the fourth cell, the in-cell PG track and the second PG conductive element are electrically connected by a connection in the padding cell.

17. The device of claim 16, wherein:

the first PG conductive element, the second PG conductive element, the third PG conductive element, the first set of at least three conductive tracks, and the second set of at least three conductive tracks are formed in a same first layer, the first, second, third, and fourth cells each have at least one active region in a substrate, a metal over diffusion layer is over the active regions, the first layer is a lowermost conductive material layer over the metal over diffusion layer, and the connection is aligned with a metal over diffusion element in the padding cell, and is between the metal over diffusion element and the first layer.

18. The device of claim 16, wherein:

a height in the second direction of the second PG conductive element changes in the padding cell, and in the fourth cell, the second PG conductive element and the in-cell PG track are integral along the first direction.

19. A method of fabricating an integrated circuit device, the method comprising:

forming first, second, and third power/ground (PG) conductive elements extending in a first direction;

forming a first set of at least three conductive tracks between the first and second PG conductive elements and a second set of at least three conductive tracks between the second and third PG conductive elements, the conductive tracks being formed in equal numbers between the first and second PG conductive elements and between the second and third PG conductive elements;

forming circuits in a first row of cells arranged in the first direction and overlapping the first set of at least three conductive tracks; and forming circuits in a second row of cells arranged in the first direction and overlapping the second set of at least three conductive tracks, wherein:

in the first row of cells, a first cell has a first height in a second direction, orthogonal to the first direction, in the first row of cells, a second cell has a height that is greater than the first height, in the second row of cells, a third cell shares a boundary extending in the first direction with the first cell and has the first height, in the second row of cells, a fourth cell shares a boundary extending in the first direction with the second cell and has a height less than the first height, combined heights of the second and fourth cells corresponding to combined heights of the first and third cells, and between the second and third PG conductive elements, a conductive track is aligned with a boundary, extending in the first direction, of the second and fourth cells and is formed as an in-cell PG track.

20. The method of claim 19, wherein:

the forming circuits in the first row of cells includes forming a first transistor in the second cell such that a source of the first transistor is electrically connected to the in-cell PG track;

the forming circuits in the second row of cells includes forming a second transistor in the fourth cell such that a source of the second transistor is electrically connected to the in-cell PG track; and the forming the in-cell PG track includes at least one of forming a first electrical connection or forming a second electrical connection to electrically connect the in-cell PG track with the second PG conductive element, the forming the first electrical connection including:

forming an extended via connection that extends in the second direction and connects the in-cell PG track and the second PG conductive element, wherein the first PG conductive element, the second PG conductive element, the third PG conductive element, the first set of at least three conductive tracks, and the second set of at least three conductive tracks are formed in a same conductive layer; and the forming the second electrical connection including:

forming a connection that connects the in-cell PG track and the second PG conductive element, wherein the connection is formed in a padding cell that extends in the second direction between the first cell and the third cell and between the second cell and the fourth cell.

* * * * *